(12) United States Patent
Fukuoka et al.

(10) Patent No.: US 10,192,814 B2
(45) Date of Patent: Jan. 29, 2019

(54) ELECTRONIC ASSEMBLIES HAVING A COOLING CHIP LAYER WITH FLUID CHANNELS AND THROUGH SUBSTRATE VIAS

(71) Applicant: Toyota Motor Engineering & Manufacturing North America, Inc., Erlanger, KY (US)

(72) Inventors: Yuji Fukuoka, Northville, MI (US); Ercan Dede, Ann Arbor, MI (US); Kyosuke Miyagi, Ann Arbor, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 0 days.

(21) Appl. No.: 15/423,636

(22) Filed: Feb. 3, 2017

(65) Prior Publication Data

US 2018/0145009 A1    May 24, 2018

Related U.S. Application Data

(60) Provisional application No. 62/424,111, filed on Nov. 18, 2016.

(51) Int. Cl.
*H01L 23/473* (2006.01)
*H01L 23/498* (2006.01)
*H01L 23/367* (2006.01)

(52) U.S. Cl.
CPC .... *H01L 23/49827* (2013.01); *H01L 23/3677* (2013.01); *H01L 23/4735* (2013.01)

(58) Field of Classification Search
CPC ............... H01L 23/473; H01L 23/3675; H01L 23/49827
See application file for complete search history.

(56) References Cited

U.S. PATENT DOCUMENTS

| | | | |
|---|---|---|---|
| 7,516,776 B2 | 4/2009 | Bezama et al. |
| 7,592,697 B2 | 9/2009 | Arana et al. |
| 8,012,808 B2 | 9/2011 | Shi et al. |
| 8,049,329 B2 | 11/2011 | Baek et al. |
| 8,198,174 B2 | 6/2012 | Hsu et al. |
| 8,659,896 B2 | 2/2014 | Dede et al. |
| 8,829,670 B1 | 9/2014 | Zhang et al. |
| 8,981,556 B2 | 3/2015 | Joshi |
| 9,220,184 B2 | 12/2015 | Ranjan et al. |
| 9,312,202 B2 | 4/2016 | Bouras |

(Continued)

FOREIGN PATENT DOCUMENTS

CN            101916757         12/2011

*Primary Examiner* — Moazzam Hossain
*Assistant Examiner* — Warren H Kilpatrick
(74) *Attorney, Agent, or Firm* — Dinsmore & Shohl LLP

(57) ABSTRACT

An electronics assembly includes a cooling chip structure having a device facing surface opposite a base surface and one or more sidewalls extending around a perimeter of the cooling chip structure between the device facing surface and the base surface. A plurality of fluid microchannels fluidly are coupled to a fluid inlet port and a fluid outlet port. A through substrate via extends from the base surface of the cooling chip structure to the device facing surface of the cooling chip structure, where the through substrate via intersects two or more fluid microchannels of the plurality of fluid microchannels.

20 Claims, 15 Drawing Sheets

(56) References Cited

U.S. PATENT DOCUMENTS

| | | |
|---|---|---|
| 9,313,921 B2 | 4/2016 | Brunschwiler et al. |
| 2012/0331433 A1* | 12/2012 | Brunschwiler ....... H01L 23/473 716/110 |
| 2014/0190665 A1 | 7/2014 | Joshi et al. |
| 2014/0290916 A1 | 10/2014 | Arik et al. |
| 2015/0221613 A1 | 8/2015 | Andry et al. |

* cited by examiner

ELECTRONIC ASSEMBLIES HAVING A COOLING CHIP LAYER WITH FLUID CHANNELS AND THROUGH SUBSTRATE VIAS

CROSS-REFERENCE TO RELATED APPLICATIONS

This application claims the benefit of U.S. Provisional Application No. 62/424,111, entitled "ELECTRONIC ASSEMBLIES HAVING A COOLING CHIP LAYER WITH FLUID CHANNELS AND THROUGH SUBSTRATE VIAS," filed Nov. 18, 2016, the entirety of which is hereby incorporated by reference.

TECHNICAL FIELD

The present specification generally relates to apparatuses for cooling heat generating devices such as power electronic devices and, more specifically, to cooling apparatuses and power electronic modules having through substrate vias incorporated in cooling layers.

BACKGROUND

Heat sinking devices may be coupled to a heat generating device, such as a power electronics device, to remove heat and lower the maximum operating temperature of the heat generating device. Cooling fluid may be used to receive heat generated by the heat generating device by convective thermal transfer and remove such heat from the heat generating device. For example, a jet of cooling fluid may be directed such that it impinges a surface of the heat generating device. Another method may include removing heat from a heat generating device by passing cooling fluid between and around a finned heat sink made of thermally conductive material, such as aluminum.

However, as power electronic devices are designed to operate at increased power levels and generate increased corresponding heat flux due to the demands of newly developed electrical systems, conventional heat sinks are unable to adequately remove the heat flux to effectively lower the operating temperature of the power electronics to acceptable temperature levels. Further, as power electronic devices are designed with electrical interfaces across a variety of surfaces, including desirable surfaces for placement of cooling structures, the placement and integration of conventional heat sink and cooling structures present a challenge. Additionally, conventional heat sinks and cooling structures require additional bonding layers and thermal matching materials (e.g. bond layers, substrates, thermal interface materials). These additional layers add substantial thermal resistance to the overall assembly and make thermal management of the electronics system challenging.

Accordingly, a need exists for alternative power electronic assemblies and power electronics devices having cooling structures that also provide electrical interfaces.

SUMMARY

In one embodiment, an electronics assembly includes a cooling chip structure having a device facing surface opposite a base surface and one or more sidewalls extending around a perimeter of the cooling chip structure between the device facing surface and the base surface. The cooling chip structure also includes a fluid inlet port, a fluid outlet port, and a plurality of fluid microchannels fluidly coupled to the fluid inlet port and the fluid outlet port. The cooling chip structure also includes a through substrate via extending from the base surface of the cooling chip structure to the device facing surface of the cooling chip structure. The through substrate via intersects two or more fluid microchannels of the plurality of fluid microchannels.

In another embodiment, an electronics assembly includes a cooling chip structure having a device facing surface opposite a base surface, one or more sidewalls extending around a perimeter of the cooling chip structure between the device facing surface and the base surface, and a fluid inlet port and a fluid outlet port. The cooling chip structure also includes a plurality of fluid microchannels fluidly coupled to the fluid inlet port and the fluid outlet port and a through substrate via extending from the base surface of the cooling chip structure to the device facing surface of the cooling chip structure. A first fluid microchannel of the plurality of fluid microchannels is closer to a midpoint of the through substrate via along an axis than a second fluid microchannel of the plurality of fluid microchannels. The first fluid microchannel comprises a first cross-sectional fluid area that is smaller than a second cross-sectional fluid area of the second fluid microchannel.

In yet another embodiment, an electronics assembly includes a cooling chip structure having a device facing surface opposite a base surface, one or more sidewalls extending around a perimeter of the cooling chip structure between the device facing surface and the base surface and a fluid inlet port and a fluid outlet port. The cooling chip structure also includes a plurality of fluid microchannels fluidly coupled to the fluid inlet port and the fluid outlet port. The plurality of fluid microchannels include a first fluid microchannel and a second fluid microchannel. The cooling chip structure includes a through substrate via extending from the base surface of the cooling chip structure to the device facing surface of the cooling chip structure. The through substrate via is positioned adjacent the first fluid microchannel and the second fluid microchannel.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
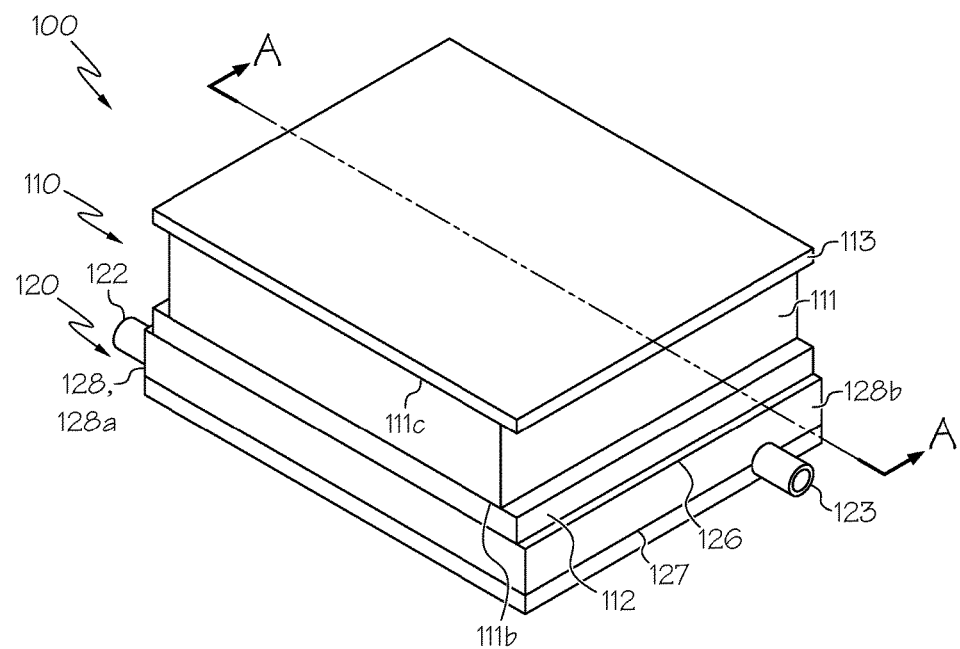
FIG. 1 schematically depicts a perspective view of an example electronics assembly comprising a semiconductor device stack and a cooling chip structure having a through substrate via according to one or more embodiments shown and described herein.
Figure 2:
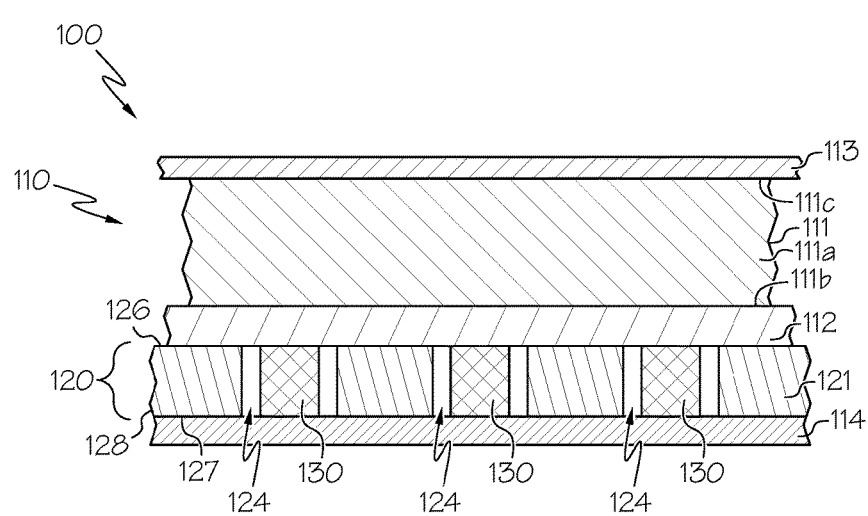
FIG. 2 schematically depicts a cross-sectional view of the example electronics assembly of FIG. 1 having integrated fluid microchannels according to one or more embodiments shown and descried herein.
Figure 7:
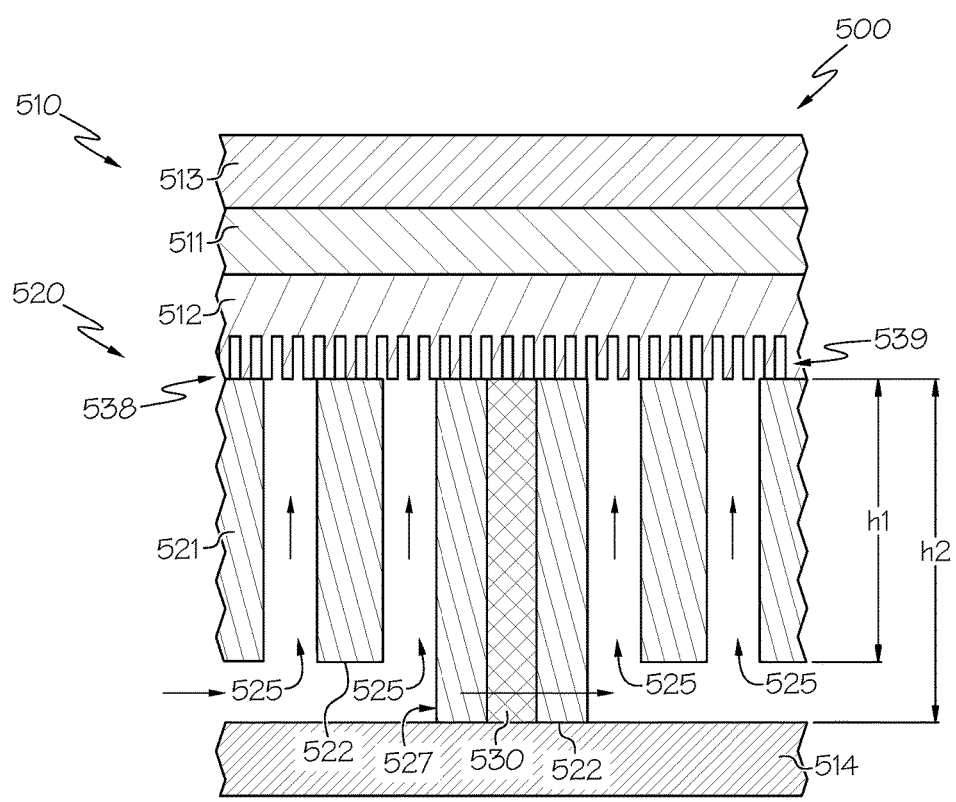
FIG. 7 schematically depicts a cross-sectional view of an electronics assembly having a semiconductor device stack and a cooling chip structure comprising jet channels and a through substrate via according to one or more embodiments shown and described herein.

FIGS. 1 and 2 generally depict one embodiment of an electronics assembly having a cooling chip structure coupled to a semiconductor device stack. The cooling chip structure includes through substrate vias electrically coupled to a semiconductor device. Thus, the cooling chip structure provides not only cooling, but also electrical interconnectivity. Including through substrate vias may increase electrical connection density of the electronics assembly, as well as reduce ON-resistance of the semiconductor device. The through substrate vias are generally interlaced with cooling fluid channels within the cooling chip structure. The cooling fluid channels are fluidly coupled to a fluid inlet port and a fluid outlet port adjacent to the through substrate vias. In operation, dielectric cooling fluid may be circulated through the cooling chip structure to remove heat from the power electronics device while the through substrate vias within the cooling chip structure provide electrical connectivity to the semiconductor device (e.g., from a third electrode). In various embodiments, cooling fluid channels comprise fluid microchannels and/or jet channels (as shown in FIG. 7) arranged to remove heat from portions of the semiconductor device. Moreover, the fluid microchannels and/or jet channels may be positioned to not only lower the overall heat produced by the semiconductor device but also reduce localized hotspots. For instance, the embodiments herein address cooling of localized hotspots caused by the placement of through substrate vias, which reduce the contact area of the heat sink and/or cooling fluid with the semiconductor device stack, (i.e. areas of high heat density). Various embodiments of the electronics assembly having a cooling chip structure will be described in more detail herein.

Referring now to FIGS. 1 and 2, an example electronics assembly 100 comprising a semiconductor device stack 110 coupled to a cooling chip structure 120 is depicted. FIG. 1 depicts a perspective view of the electronics assembly 100, and FIG. 2 depicts a cross-section view of the electronics assembly 100 along line A-A of FIG. 1. As depicted in FIGS. 1 and 2, the electronics assembly 100 includes a semiconductor device stack 110 having a semiconductor device 111 coupled to a first electrode 112 on a first device surface 111b of the semiconductor device and to a second electrode 113 on a second device surface 111c of the semiconductor device 111. The first electrode 112 may be electrically coupled to the semiconductor device 111 to facilitate electrical power transfer between the semiconductor device 111 and a connected power system, such as, without limitation, a vehicle power system of an electrified vehicle (not shown). It should be understood that the electrodes described herein may be a single electrode (e.g., a sheet of electrically conductive material) or a patterned electrically conductive layer providing electrical connections for multiple signals (e.g., patterns defined by electrically conductive traces).

Referring particularly to FIG. 2, the cooling chip structure 120 comprises a substrate 121, one or more through substrate vias 130 and one or more fluid microchannels 124. The one or more through substrate vias 130 electrically couple the first electrode 112 to a third electrode 114 or optionally to a connected power system. In FIG. 2, the through substrate vias 130 are positioned in the cooling chip structure 120. The through substrate vias 130 may be adjacent one or more fluid microchannels 124. The fluid microchannels 124 fluidly couple a fluid inlet port 122 to the fluid outlet port 123 (See FIG. 1). The fluid microchannels 124 extend within the cooling chip structure 120 to provide fluid flow paths for dielectric cooling fluid to flow from the fluid inlet port 122 to the fluid outlet port 123 such that heat created by the semiconductor device 111 may be removed from the semiconductor device stack 110. Non-limiting dielectric cooling fluids include R-245fa and HFE-7100. Other dielectric cooling fluids may be utilized. The type of dielectric cooling fluid chosen may depend on the operating temperature of the heat generating devices to be cooled.

The illustrated cooling chip structure 120 of the electronics assembly 100 may comprise any substrate material, for example a high temperature co-fired ceramic (HTCC) material, a low temperature co-fired ceramic (LTCC) material, FR-4, or the like. The cooling chip structure may also be a semiconductor material, for example, without limitation, Si, SiC, GaN, AlN, BN, diamond, or the like. The cooling chip structure 120 may comprise a high temperature substrate material such as HTCC, that is compositionally configured to withstand a temperature greater than or equal to about an operating temperature of the semiconductor device 111 without substantially deforming or otherwise deteriorating, for example, temperatures greater than about 250° C., 280° C., 300° C., 320° C., 350° C., or the like. As depicted in the example electronics assembly 100 of FIG. 1, the cooling chip structure 120 comprises a device facing surface 126 opposite a base surface 127. Further, the cooling chip structure 120 comprises one or more sidewalls 128 extending around a perimeter of the cooling chip structure 120 between the device facing surface 126 and the base surface 127. It should be understood that other configurations are also possible.

The cooling chip structure 120 comprises a fluid inlet port 122 and a fluid outlet port 123. The fluid inlet port 122 and fluid outlet port 123 are fluidly coupled to the fluid microchannels 124. The fluid inlet port 122 and the fluid outlet port 123 may each extend into the one or more sidewalls 128, as depicted in FIGS. 1 and 2. For example, the fluid inlet port 122 may extend into the first sidewall 128a and the fluid outlet port 123 may extend into the second sidewall 128b. In a non-limiting example, one or both of the fluid inlet port 122 and the fluid outlet port 123 may extend into the base surface 127 of the cooling chip structure 120. In another, non-limiting example, one or both of the fluid inlet port 122 and the fluid outlet port 123 may extend into the device facing surface 126 of the cooling chip structure 120. In yet another, non-limiting example, the fluid inlet port is fluidly coupled to a dielectric cooling fluid reservoir (not shown) and the fluid outlet port is fluidly coupled to a heat exchanger (not shown).

Still referring to FIGS. 1 and 2, in some embodiments, the semiconductor device 111 may comprise a wide bandgap semiconductor device. As non-limiting examples, the semiconductor device material 111a may comprise, without limitation, wide bandgap materials such as SiC, GaN, AlN, BN, diamond, or the like. As a non-limiting example, the semiconductor device material 111a may be any semiconductor material comprising a bandgap of about 3 eV or more. In other embodiments, the semiconductor device material 111a may comprise any semiconductor material, such as Si. In some embodiments, the semiconductor device 111 may comprise an insulated-gate bi-polar transistor ("IGBT"), a metal-oxide-semiconductor field-effect transistor ("MOSFET") or any other semiconductor device. Further, as a non-limiting example, the semiconductor device 111 may operate at temperatures between about 250° C. and about 350° C. It should be understood that other operation temperatures are possible.

As depicted in FIGS. 1 and 2, the semiconductor device 111 comprises a first device surface 111b opposite a second device surface 111c. The first device surface 111b faces a first electrode 112, for example, in contact with and/or coupled to the first electrode 112, such that the first electrode 112 is positioned between the cooling chip structure 120 and the semiconductor device 111. For example, in some embodiments, the first electrode 112 may comprise a discrete metal layer that is bonded to the first device surface 111b and in other embodiments the first electrode 112 may comprise a metallization layer that is deposited onto the first device surface 111b using any known or yet to be developed deposition methods. In some embodiments, the first electrode 112 is also coupled to the device facing surface 126 of the cooling chip structure 120, (e.g., bonded to the device facing surface 126). Moreover, in some embodiments, additional component layers may be positioned between the first electrode 112 and the device facing surface 126 of the cooling chip structure 120.

Referring still to FIGS. 1 and 2, the second device surface 111c faces a second electrode 113, for example, in contact with and/or coupled to, such that the second electrode 113 is positioned opposite the first electrode 112. For example, in some embodiments, the second electrode 113 may comprise a discrete metal layer that is bonded to the second device surface 111c and in other embodiments the second electrode 113 may comprise a metallization layer that is deposited onto the second device surface 111c using any known or yet to be developed deposition methods.

The first electrode 112 and the second electrode 113 are each thermally coupled to the semiconductor device 111. Further, the first electrode 112 and the second electrode 113 are each electrically coupled to the semiconductor device 111 such that an electrical current pathway is formed between the first electrode 112 and the second electrode 113, extending through the semiconductor device 111, for example, a vertical electrical current pathway. In some embodiments, the first electrode 112 comprises a drain electrode and the second electrode 113 comprises a source electrode such that a vertical current pathway extends through the semiconductor device 111 from the source electrode to the drain electrode and, in operation, electrical current flows from the second electrode 113 to the first electrode 112. In other embodiments, the first electrode 112 comprises a source electrode and the second electrode 113 comprises a drain electrode such that, in operation, electrical current flows from the first electrode 112 to the second electrode 113. The first electrode 112 and second electrode 113 may comprise any electrically conductive material such as, without limitation, copper, copper oxide, graphite, brass, silver, platinum, or the like.

As depicted in at least FIGS. 1 and 2, the electronics assembly 100 further comprises one or more through substrate vias 130 coupled to the semiconductor device stack 110. The one or more through substrate vias 130 are electrically coupled to the semiconductor device stack 110.

Optionally, the one or more through substrate vias 130 electrically couple the semiconductor device stack 110 to a third electrode 114. For example, the third electrode may be positioned on the base surface 127 of the cooling chip structure 120 such that the one or more through substrate vias 130 traverse the cooling chip structure 120 and electrically couple the third electrode 114 to the semiconductor device stack 110.

The through substrate vias 130 are electrically conductive conduits that pass through the cooling chip structure 120. Through substrate vias 130 comprise a conductive material enabling current flow from one electrical element to another electrical element through the cooling chip structure 120. The through substrate vias 130 may be filled with any electrically conductive material such as, without limitation, aluminum, copper, copper oxide, graphite, brass, gold, silver, platinum, or the like.

The one or more through substrate vias 130 generally engage the semiconductor device 111 as a power busbar, however, it should be understood that the through substrate vias 130 may be electrically coupled for the purposes of signal transmission and/or other electrical connectivity needs. Additionally, one or more of the through substrate vias 130 may be connected to different semiconductor devices in the semiconductor device stack 110 providing various electrical interfaces beyond the cooling chip structure 120. In operation, the one or more through substrate vias 130, may output a power signal receivable by the semiconductor device stack 110 to power the semiconductor device stack 110. Further, the one or more through substrate vias 130 may output a control signal receivable by the semiconductor device stack 110 to control the operation of the semiconductor device 111, e.g., the switching operation of a wide bandgap semiconductor device. In some embodiments, the one or more through substrate vias 130 may each electrically couple multiple semiconductor device stacks 110.

Referring specifically to FIG. 2, the cooling chip structure 120 comprises one or more through substrate vias 130 that traverse the cooling chip structure 120 and are electrically coupled to the first electrode 112 of the semiconductor device stack 110. Further, fluid microchannels 124 extend within the cooling chip structure 120 such that dielectric cooling fluid may flow from the fluid inlet port 122 through the fluid microchannels 124 around the through substrate vias 130 and out of the cooling chip structure 120 through the fluid outlet port 123.

Figure 3:
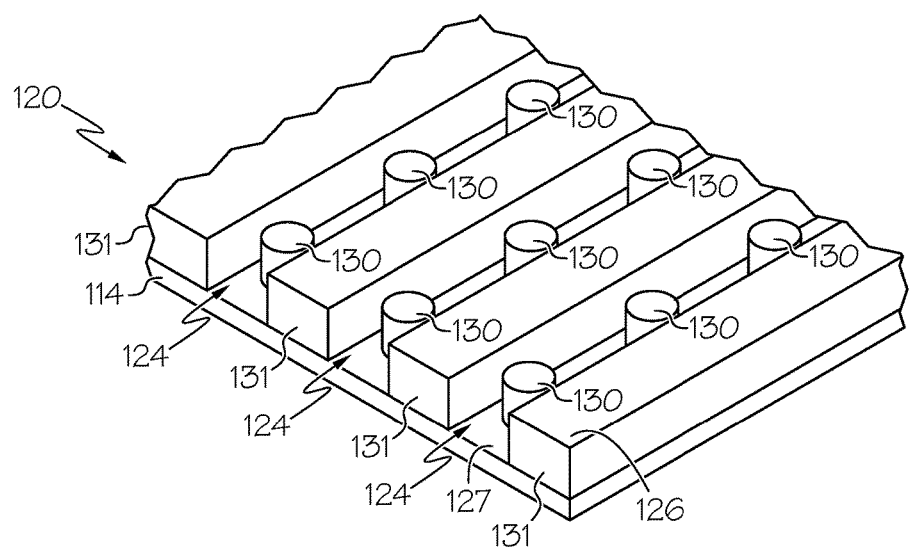
FIG. 3 schematically depicts a top perspective view of a partial cooling chip structure having through substrate vias positioned within fluid microchannels according to one or more embodiments shown and described herein.

Referring now to FIG. 3, an example top perspective view of a partial cooling chip structure 120 having fluid microchannels 124 and through substrate vias 130 is schematically depicted. As depicted, the through substrate vias 130 extend from the base surface 127 to the device facing surface 126 of the cooling chip structure 120 and are positioned within the fluid microchannels 124. The fluid microchannels 124 may be defined by an array of fins 131, such as, without limitation, pin fins and channel fins that collectively define at least a portion of a fluid flow path of the one or more fluid microchannels 124. The one or more fluid microchannels 124 may include through substrate vias 130 disposed within each of the one or more fluid microchannels 124. Alternatively, a fluid microchannel 124 may include no through substrate vias 130, while an adjacent fluid microchannel 124 may include one or more through substrate vias 130. In some embodiments, the cooling chip structure 120 includes a single fluid microchannel 124 and a single through substrate via 130, however it should be understood that any number of fluid microchannels 124 and through substrate vias 130 are contemplated.

Figure 4:
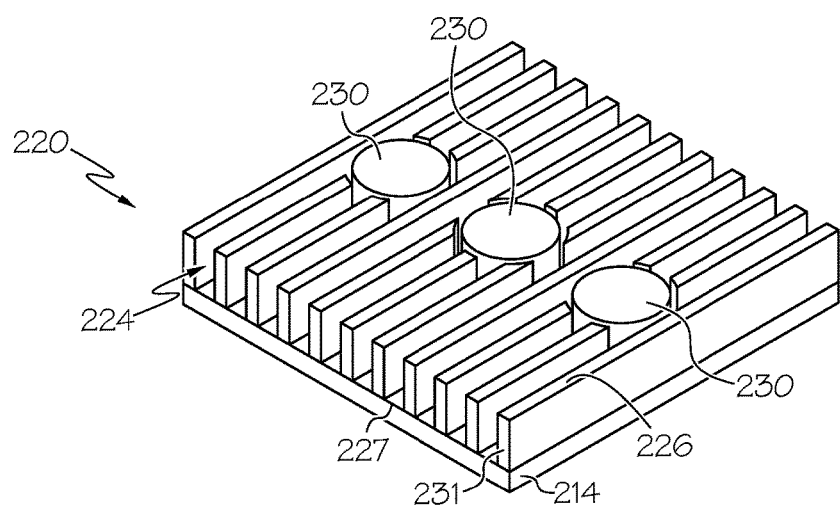
FIG. 4 schematically depicts another perspective view of a partial cooling chip structure having fluid microchannels intersected by through substrate vias according to one or more embodiments shown and described herein.

Referring now to FIG. 4, another embodiment of a cooling chip structure 220 having fluid microchannels 224 and through substrate vias 230 is depicted. As depicted, one or more through substrate vias 230 extend from a base surface 227 to a device facing surface 226 of the cooling chip structure 220. In some embodiments, the one or more through substrate vias 230 intersect one or more fluid microchannels 224, for example, a single through substrate via 230 may intersect multiple fluid microchannels 224. In operation, dielectric cooling fluid may flow within the one or more fluid microchannels 224 such that dielectric cooling fluid flowing in one fluid microchannel 224 is separated from dielectric cooling fluid flowing in an adjacent fluid microchannel 224 by an array of fins 231 that form the one or more fluid microchannels 224. In operation, the dielectric cooling fluid flowing within some or all of the fluid microchannels 224 converges around the one or more through substrate vias 230. For example, in some embodiments, fluid flowing within each individual fluid microchannel may contact at least one through substrate via 230 and in other embodiments, fluid flowing within at least one fluid microchannel 224 may traverse the fluid microchannel 224 without contacting a through substrate via 230. In some embodiments, once the dielectric cooling fluid converges around the through substrate vias 230, the dielectric cooling fluid exits the cooling chip structure 220 through a fluid outlet port (not shown). In other embodiments, once the dielectric cooling fluid converges around the through substrate vias 230 the dielectric cooling fluid is diverted into separate fluid microchannels 224. The convergence and divergence of dielectric cooling fluid may occur numerous times before the dielectric cooling fluid exits the cooling chip structure 220 through a fluid outlet port (not shown). Further, as depicted in FIG. 4, each through substrate via 230 is positioned adjacent two or more fluid microchannels 224 (e.g., a first fluid microchannel and a second fluid microchannel). Moreover, at least one fluid microchannel 224 is positioned between each through substrate via 230 and an additional through substrate via (e.g., a first through substrate via and a second through substrate via). Thus, in some embodiments, no through substrate via 230 is directly adjacent another through substrate via 230 without at least one fluid microchannel 224 disposed therebetween Referring to FIG. 5, a cross-sectional side view of an example electronics assembly 300 having a cooling chip structure 320 and a semiconductor device stack 310 is depicted. As depicted, the cooling chip structure 320 comprises a manifold layer 350 fluidly coupled to a microchannel layer 360 such that a base surface 327 is disposed on the manifold layer opposite a device facing surface 326 that is disposed on the microchannel layer. Additionally, one or more sidewalls 328 extend around a perimeter of the cooling chip structure 320 between the device facing surface 326 and the base surface 327. One or more through substrate vias 330 extend from the base surface 327 through the manifold layer 350 and the microchannel layer 360 of the cooling chip structure 320 to the device facing surface 326. The one or more through substrate vias 330 are electrically coupled to a first electrode 312 of the semiconductor device stack 310. Additionally, the one or more through substrate vias 330 may be electrically coupled to a third electrode 314 disposed on the base surface 327.

Figure 5:
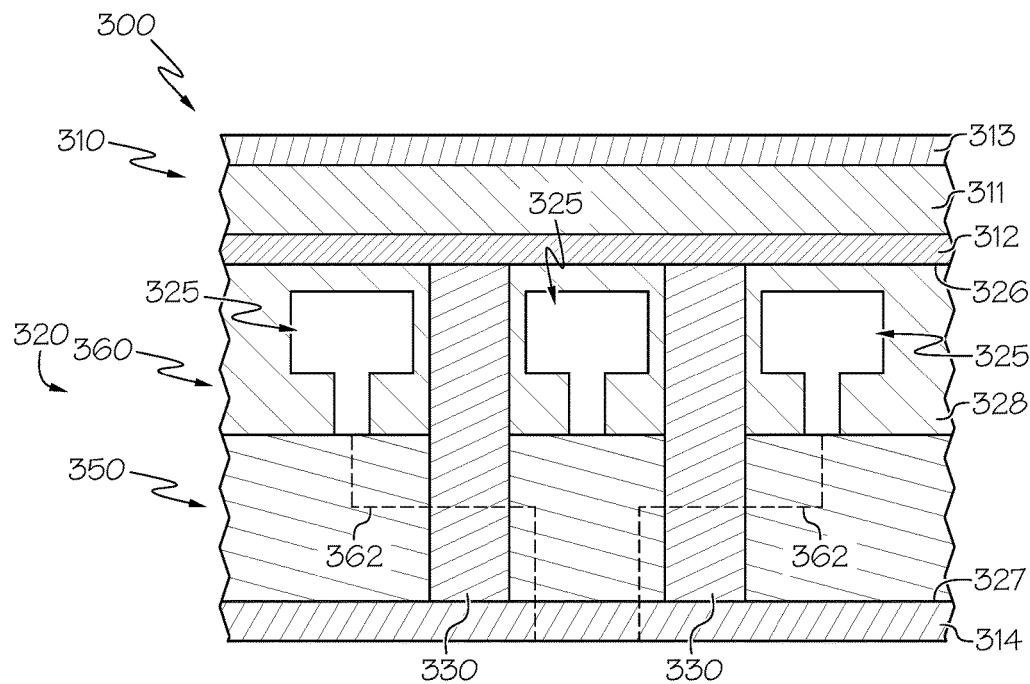
FIG. 5 schematically depicts a cross-sectional view of an example electronics assembly having a cooling chip structure and a semiconductor device stack according to one or more embodiments shown and described herein.

Still referring to FIG. 5, the microchannel layer 360 comprises a plurality of fluid microchannels 325. The plurality of fluid microchannels 325 extends within the microchannel layer 360 adjacent the one or more through substrate vias 330. In operation, dielectric cooling fluid flows from a fluid inlet port (not shown) into the manifold layer 350 and a plurality of fluid inlet channels 362 (e.g. fluid microchannels) feed the plurality of fluid microchannels 325. The dielectric cooling fluid flows within the fluid microchannels 325 and operates to remove heat from the semiconductor device stack 310 and hotspots created around the locations where the one or more through substrate vias 330 couple to the semiconductor device stack 310.

Figure 6:
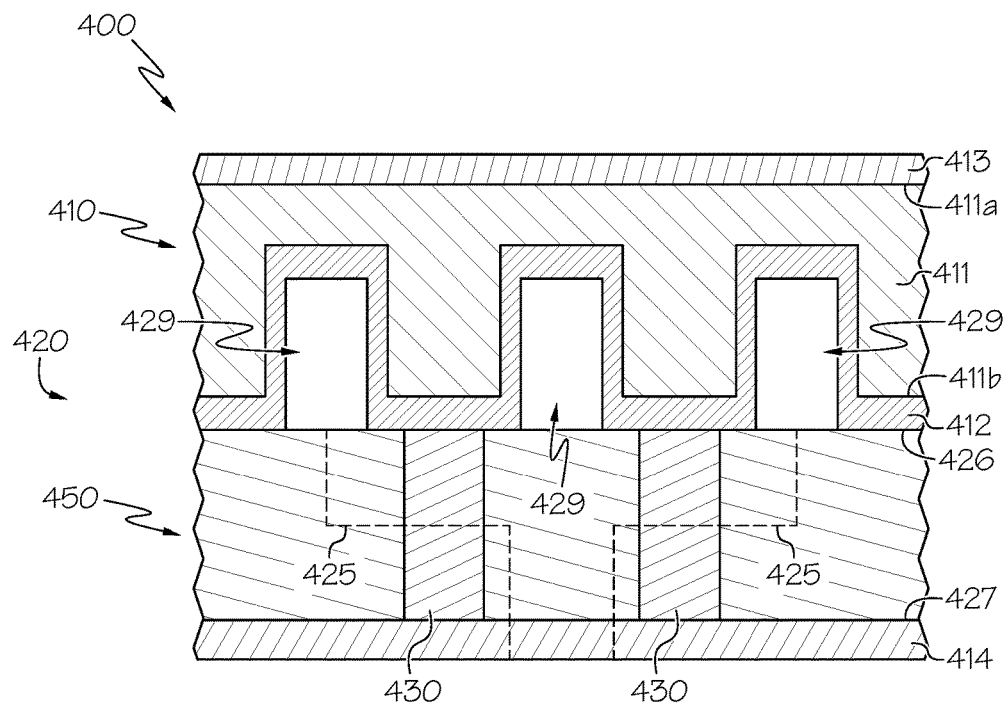
FIG. 6 schematically depicts another cross-sectional view of an example electronics assembly having a cooling chip structure and a semiconductor device stack according to one or more embodiments shown and described herein.

Referring now to FIG. 6, a cross-sectional side view of another example electronics assembly having a cooling chip structure 420 and a semiconductor device stack 410 comprising a semiconductor device 411 positioned between and electrically and thermally coupled to a first electrode 412 and a second electrode 413 is depicted. As depicted, the cooling chip structure 420 comprises a manifold layer 450 positioned between a base surface 427 of a cooling chip structure 420 and a device facing surface 426 of the cooling chip structure 420 opposite the base surface 427. The cooling chip structure 420 also comprises one or more through substrate vias 430 extending from the base surface 427 to the device facing surface 426. The one or more through substrate vias 430 are electrically coupled to a first electrode 412 of the semiconductor device stack 410. Additionally, the one or more through substrate vias 430 may be electrically coupled to a third electrode 414 disposed on the base surface 427. Further, as depicted in FIG. 2, the manifold layer 450 comprises a plurality of fluid inlet channels 425 (e.g. fluid microchannels). The plurality of fluid inlet channels 425 may extend within the manifold layer 450, for example, adjacent the one or more through substrate vias 430. In operation, dielectric cooling fluid flows from a fluid inlet port (not shown) into the manifold layer 450 and into the plurality of fluid inlet channels 425.

As depicted in FIG. 6, the semiconductor device stack 410 includes the semiconductor device 411 having a first device surface 411b opposite a second device surface 411c of the semiconductor device 411 that is coupled to the second electrode 413. In some embodiments, a plurality of semiconductor fluid microchannels 429 may extend into the semiconductor device 411. In some embodiments, the plurality of semiconductor fluid microchannels 429 may be positioned in fluid communication with the manifold layer 450 of the cooling chip structure 420 and in fluid communication with the plurality of fluid inlet channels 425 of the cooling chip structure 420. Further, the semiconductor fluid microchannels 429 are in fluid communication with the fluid inlet port (not shown) and the fluid outlet port (not shown) via the plurality of fluid inlet channels 425 of the cooling chip structure 420. In some embodiments, as depicted in FIG. 6, the semiconductor fluid microchannels 429 may extend into at least the first device surface 411b of the semiconductor device 411. Further, in some embodiments, the semiconductor fluid microchannels 429 may extend through the semiconductor device 411 from the first device surface 411b to the second device surface 411c and into the second device surface 411c. Further, as depicted in FIG. 6, in some embodiments, the first electrode 412 may be positioned along the first device surface 411b of the semiconductor device 411 such that portions of the first electrode 412 are disposed within the semiconductor fluid microchannels 429.

In other embodiments, the cooling chip structure may be configured as a jet impingement cooling structure. In such embodiments, cooling of an electronics assembly may be achieved by directing dielectric cooling fluid from a fluid inlet port through jet channels of an impingement jet layer, such that jets of dielectric cooling fluid impinge a target layer. The jet channels are generally in the direction of the through substrate vias. Use of impingement jets may allow for more precise targeting and cooling of hotspots.

Referring now to FIG. 7, a cross-sectional view of an example electronics assembly 500 having a semiconductor device stack 510 including a semiconductor device 511 positioned between and electrically and thermally coupled a first electrode 512 and a second electrode 513, as well as a cooling chip structure 520. The cooling chip structure 520 comprises a jet impingement layer 521, at least one through substrate via 530, and a target layer 538. The target layer 538 is fabricated from an electrically conductive material, and may operate as the first electrode 512 as described above. Non-limiting electrically conductive materials include, but are not limited to, copper, aluminum, and gold. The target layer 538 further includes a plurality of fins 539 that defines a plurality of microchannels. It should be understood that, in other embodiments, the target layer 538 may not include a plurality of fins.

The jet impingement layer 521 comprises a plurality of jet channels 525 configured as a plurality of through holes. The jet impingement layer 521 may be fabricated from a dielectric material, such as, without limitation, silicon. In the illustrated embodiment, the jet impingement layer 521 contacts the plurality of fins 539. The jet impingement layer 521 further comprises a through substrate via 530, which is electrically coupled to a third electrode 514. To ensure a gap between a surface 522 of the jet impingement layer 521 and the third electrode 514 through which the dielectric cooling fluid to flow, a portion 527 of the jet impingement layer 521 surrounding the through substrate via 530 has a first height $h_2$ that is greater than a second height $h_1$ of the jet impingement layer 521 surrounding the jet channels 525. Thus, the electrically conductive through substrate via 530 contacts the third electrode 514, thereby providing an electrical connection between the target layer 538 and the third electrode 514 while also providing a gap for dielectric cooling fluid to enter the jet channels 525.

As shown by the arrows, dielectric cooling fluid flows between the jet impingement layer 521 and the third electrode 514 and into the jet channels 525. The dielectric cooling fluid exits the jet channels 525 as impingement jets and impinges the target layer 538. The dielectric cooling fluid flows through the plurality of fins 539 and may be collected and removed at the fluid outlet port (not shown in FIG. 7).

It should be understood that the through substrate vias 530 may be provided in impingement jet cooling structures other than that shown in FIG. 7. Further, through substrate via 530 may make contact with the third electrode 514 in ways other than that shown in FIG. 7. In one example, the height of the jet impingement layer 521 is uniform (i.e., not larger at the through substrate via), and contact is made between the through substrate via 530 and the third electrode by raised pillars that extend from the surface of the third electrode 514 to make electrical contact with the through substrate via 530. In yet another example, the entire surface 522 of the jet impingement layer 521 contacts the third electrode 514, and the third electrode 514 further includes through holes through which dielectric cooling fluid flows from a fluid inlet channel or chamber. In still further embodiments, the plurality of fins may be disposed within the semiconductor device itself, wherein a metallization layer is disposed on the plurality of fins to provide an electrically conductive target layer that also acts as a first electrode. In yet other embodiments, an electrically conductive target layer may be disposed between a discrete first electrode (not shown) and a jet impingement layer. Other configurations are also possible.

Figure 8:
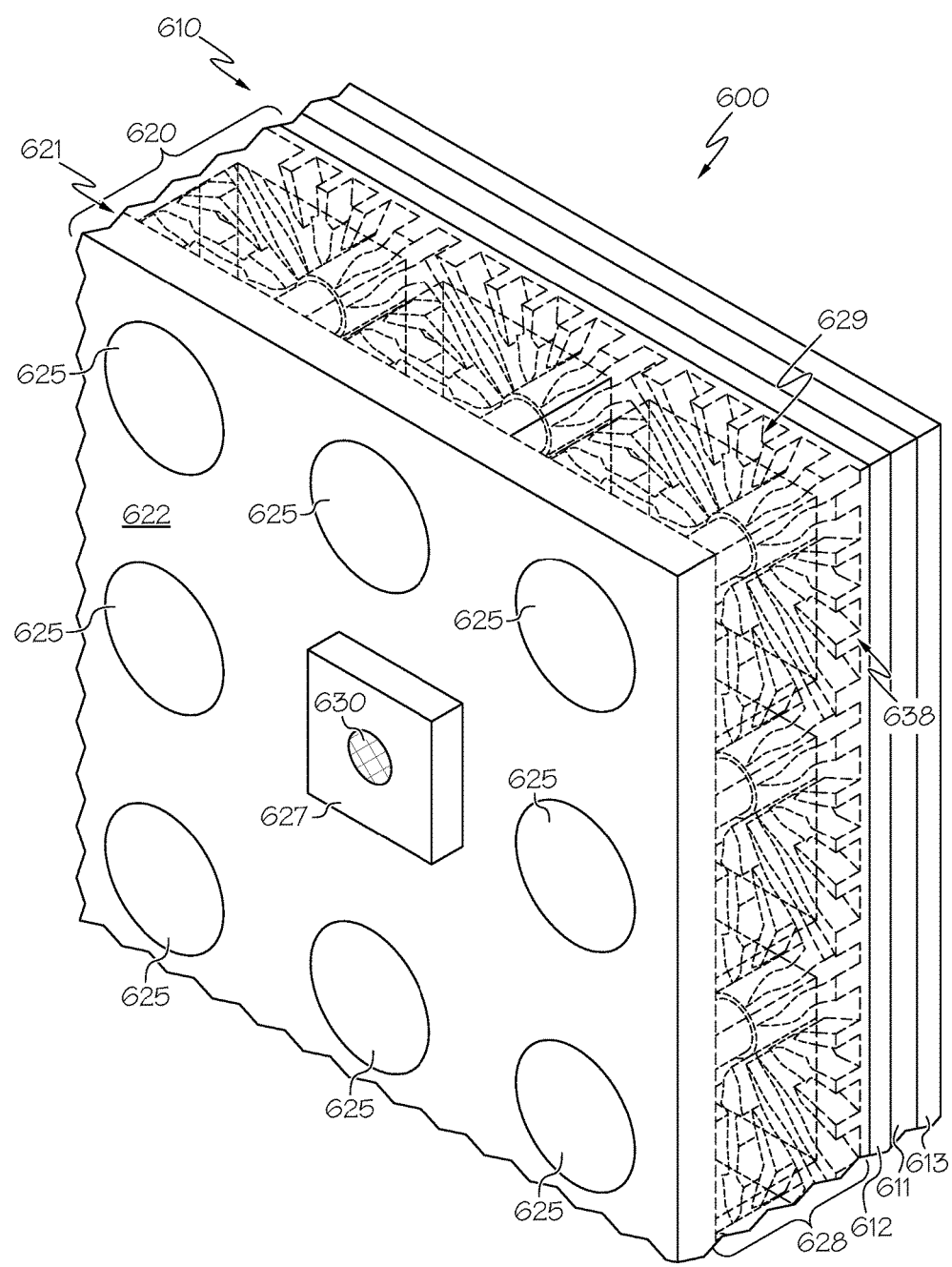
FIG. 8 schematically depicts a cross-sectional view of a cooling chip structure having an arrangement of jet channels with wavy-fin microchannels in the target layer and through substrate vias according to one or more embodiments shown and described herein.

Now referring to FIG. 8, a perspective view of another example electronics assembly 600 comprising a cooling chip structure 620 and a semiconductor device stack 610 having a semiconductor device 611, positioned between and thermally coupled to a first electrode 612 and a second electrode 613, similar to the embodiment depicted in FIG. 7, is schematically depicted. The example cooling chip structure 620 comprises a jet impingement layer 621 having a plurality of jet channels 625 coupled to a target layer 638 comprising a plurality of wavy-fins 629 that define a plurality of microchannels. The cooling chip structure 620 comprises one or more through substrate vias 630 traversing the cooling chip structure 620 and electrically coupled to the target layer 638 and therefore also the first electrode 612. As shown in FIG. 8, a portion 627 of the jet impingement layer 621 is raised surrounding the through substrate via 630 so that it may contact a third electrode (not shown) and provide a gap for dielectric cooling fluid between the third electrode 614 (FIG. 9) and the jet impingement layer 621.

In operation, the jet channels 625 direct dielectric cooling fluid toward the target layer 638 of the cooling chip structure 620. The dielectric cooling fluid flows through the jet channel 625 and impinges the target layer 638 at the impingement locations opposite the center of each jet channel 625. Thermal energy is transferred to the dielectric cooling fluid as it impinges the target layer 638 with the cooling chip structure 620. After impinging the target layer 638, the dielectric cooling fluid flows radially in all directions along a surface of the target layer 638 through the plurality of wavy-fins 629, dispersing the dielectric cooling fluid over the target layer 638 of the cooling chip structure 620. Although symmetric wavy-fin microchannel patterns are illustrated in FIG. 8, embodiments are not limited thereto. For example, the wavy-fin microchannel patterns may be asymmetrical.

Figure 9:
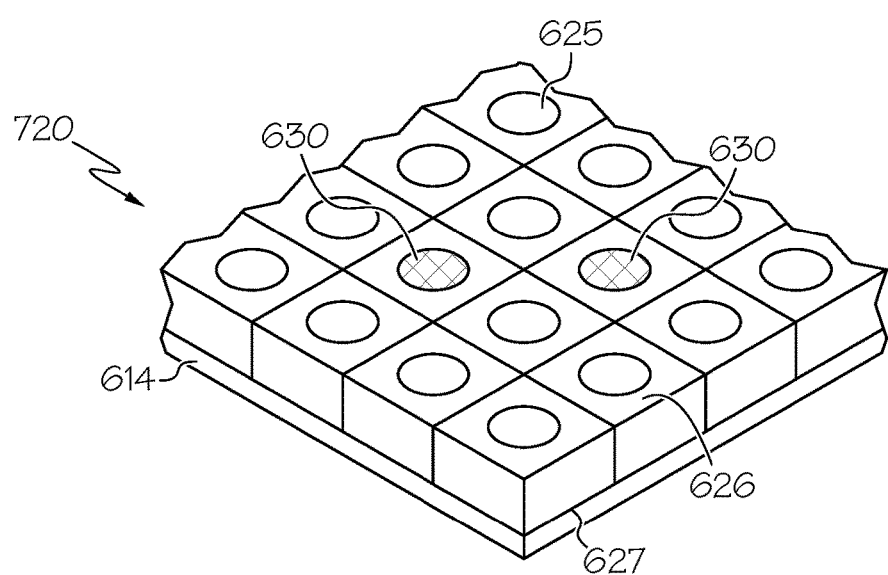
FIG. 9 schematically depicts a perspective view of a partial cooling chip structure having jet channels adjacent through substrate vias according to one or more embodiments shown and described herein.

As depicted in FIG. 9, the one or more jet channels 625 and one or more through substrate vias 630 are arranged within an example cooling chip structure 720 in a grid layout with one or more jet channels 625 positioned near each of the one or more through substrate vias 630. However, this is only a non-limiting example configuration. In other embodiments, the one or more jet channels 625 and the one or more through substrate vias 630 are not constrained to a grid layout.

Figure 10:
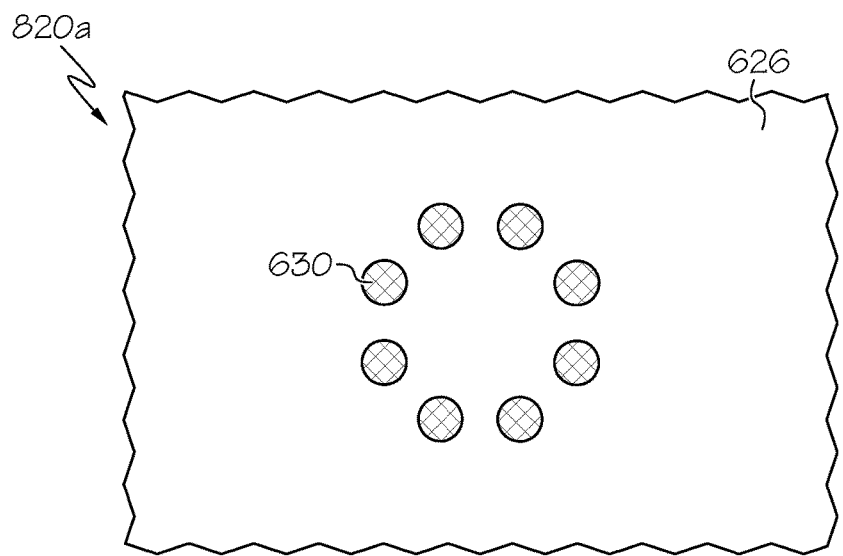
FIG. 10 schematically depicts a perspective view of a partial cooling chip structure having an arrangement of through substrate vias according to one or more embodiments shown and described herein.

In FIG. 10, example configurations of example cooling chip structures 820a having only through substrate vias 630 independent of fluid microchannels and/or jet channels are schematically depicted. The positioning of through substrate vias 630 independent of fluid flow cooling from fluid microchannels and/or jet channels effects the dispersion of heat around the through substrate via and electrode coupling, as well as reduces the ON-resistance of the semiconductor device. In embodiments where the cooling chip structure 820a includes one or more through substrate vias 630, the locations occupied by the one or more through substrate vias 630 form additional hotspots on the target surface 626 of the cooling chip and the opposing coupled portion of the semiconductor device stack 510, 610 (shown in FIGS. 7 and 8). These additional hotspots generally form where the one or more through substrate vias 630 electrically couple to the semiconductor device stack 510, 610 because dielectric cooling fluid is not present at these locations. To reduce the hotspots, strategic positioning of fluid microchannels 124, 224 (See FIGS. 3 and 4) and/or jet channels 525, 625 along with the strategic positioning of one or more through substrate vias 530, 630 reduces the intensity of localized hotspots. However, independent of the strategic positioning of fluid microchannels 124, 224 (See FIGS. 3 and 4) and/or jet channels 525, 625, the positioning of the through substrate vias 530, 630 and the number of through substrate vias 530, 630, alone may affect dispersion of these hotspots. FIG. 10 provides exemplary configurations of through substrate vias 630 strategically positioned to reduce the localization of hotspots.

In FIG. 10, an example arrangement of eight through substrate vias 630 positioned in an octagonal or generally circular array within the cooling chip structure 820a is depicted. The positioning of eight through substrate vias 630 in an octagonal or generally circular array, as depicted in FIG. 10, may lower the semiconductor device temperature and ON-resistance as compared to an arrangement having the same size and power with fewer through substrate vias 630, or having eight through substrate vias 630 arranged in a random array.

Figure 11:
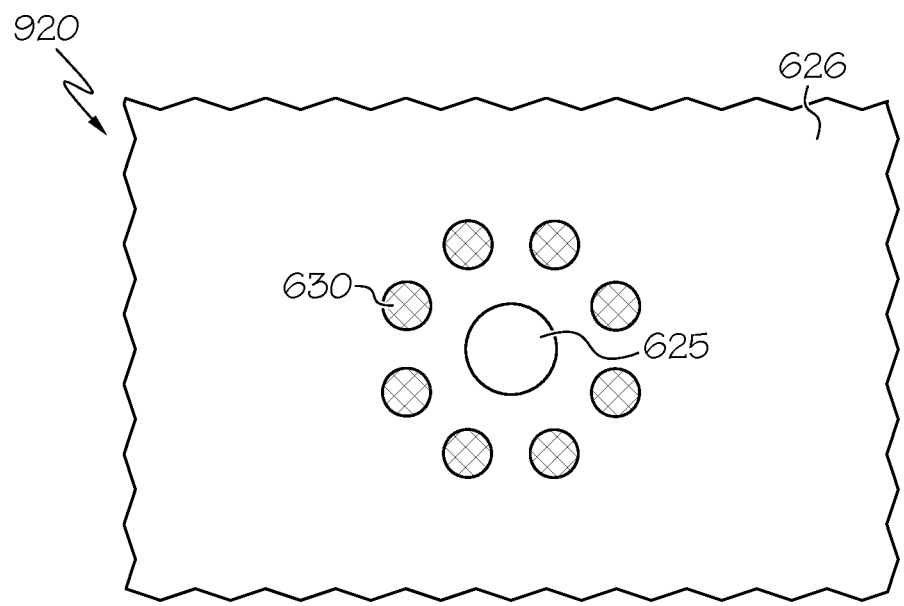
FIG. 11 schematically depicts a perspective view of a partial cooling chip structure having jet channels adjacent through substrate vias according to one or more embodiments shown and described herein.

Referring to FIG. 11, an example top view of a cooling chip structure 920 having an octagonal arrangement of through substrate vias 630 and adjacent jet channels 625 is schematically depicted. As previously discussed, specific placement of through substrate vias 630 independent of fluid microchannels 124, 224 (See FIGS. 3 and 4) and/or jet channels 625 may reduce localized hotspots. The embodiment of FIG. 11 depicts an exemplary configuration of an octagonal arrangement of through substrate vias 630 with adjacent jet channels 625 that further reduce the localized hotspots.

In yet further embodiments, varying the cross-sectional fluid area of the fluid microchannels and jet channels may improve dielectric cooling fluid flow and reduce localized hotspots. For example, increasing cooling fluid velocity near the through substrate vias may reduce localized hotspots. Increasing the cooling fluid velocity may be achieved by varying the cross-sectional fluid area of the fluid microchannels and jet channels adjacent the through substrate vias. The change in the cross-sectional fluid area changes the velocity of the fluid flow within the fluid microchannel. A fluid microchannel with a small cross-sectional area as compared to a fluid microchannel with a large cross-sectional area has a higher fluid flow velocity through the channel. A higher velocity of fluid flow may be beneficial for removing the excess heat from localized hotspots.

Figure 12A:
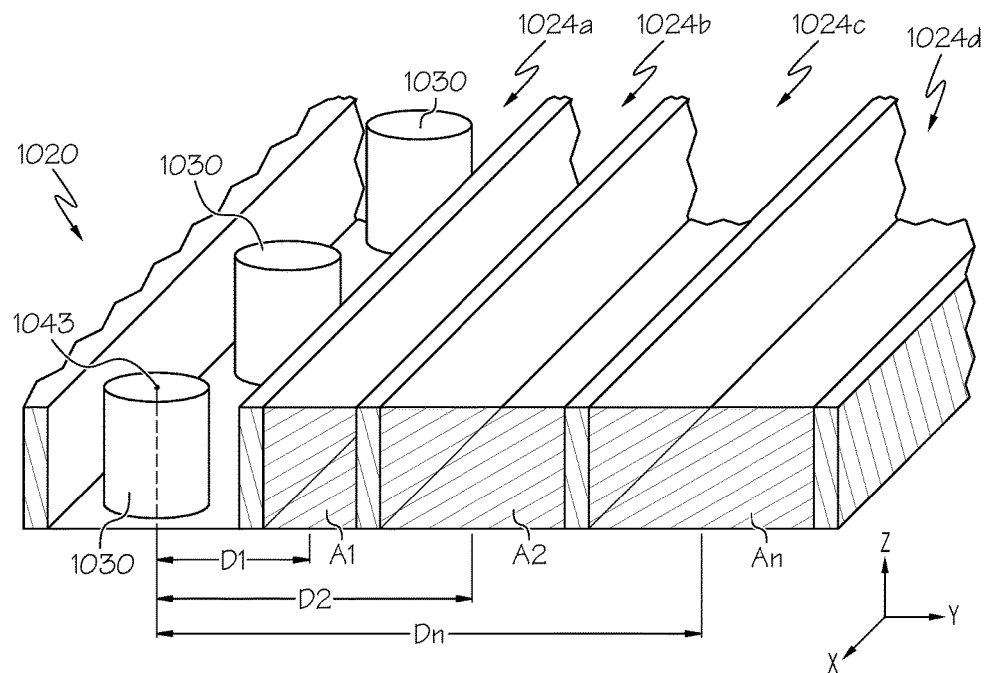
FIG. 12A schematically depicts a cross-sectional side view of a cooling chip structure comprising through substrate vias and fluid microchannels of varying cross-sectional fluid area according to one or more embodiments shown and described herein.

Referring to FIG. 12A, a cross-sectional side view of a cooling chip structure 1020 having fluid microchannels 1024 of varying cross-sectional fluid area as a function of the distance from one or more through substrate vias 1030 is depicted. As depicted, the one or more through substrate vias 1030 are disposed within a first fluid microchannel 1024a. A second fluid microchannel 1024b is adjacent the first fluid microchannel 1024a and a third fluid microchannel 1024c is adjacent the second fluid microchannel 1024b such that the second fluid microchannel 1024b is positioned between the first fluid microchannel 1024a and the third fluid microchannel 1024c. The second fluid microchannel 1024b is positioned at a first distance D1 along a depicted Y-axis from a midpoint 1043 of an individual through substrate via 1030. The third fluid microchannel 1024c is position at a second distance D2 along the depicted Y-axis from a midpoint 1043 of an individual through substrate via 1030. The second distance D2 is greater than the first distance D1. Similarly, the second fluid microchannel 1024b has a first cross-sectional fluid area A1 and the third fluid microchannel 1024c has a second cross-sectional fluid area A2. The second cross-section area A2 is greater than the first cross-sectional fluid area A1. In some embodiments, as the distance between each adjacent fluid microchannel 1024a, 1024b, 1024c and the closest through substrate via 1030 increases, so does the cross-sectional fluid area of each adjacent fluid microchannel.

For example, a second fluid microchannel 1024b is positioned a first distance of D1 from an individual through substrate via 1030 disposed within the first fluid microchannel 1024a and comprises a first cross-sectional fluid area A1. The third fluid microchannel 1024c is positioned a second distance of D2 from an individual through substrate via 1030 disposed within the first fluid microchannel 1024a and comprises a second cross-sectional fluid area A2. The first distance D1 is less than the second distance D2 and the first cross sectional fluid area A1 is less than the second cross-sectional fluid area A2. Further, a fourth fluid microchannel 1024d is positioned a distance Dn from an individual through substrate via 1030 disposed within the first fluid microchannel 1024a and comprises a cross-sectional fluid area An. The distance Dn is greater than both the first distance D1 and the second distance D2 and the cross sectional area An is greater than both the first cross sectional fluid area A1 and the second cross-sectional fluid area A2. In other embodiments, as the distance between each adjacent fluid microchannel 1024a, 1024b, 1024c, 1024d and the closest through substrate via 1030 increases, so does the cross-sectional fluid area of each adjacent fluid microchannel 1024a, 1024b, 1024c, 1024d until a defined maximum cross-sectional fluid area is reached. For example, each subsequent fluid microchannel 1024 positioned beyond the third fluid microchannel 1024c (e.g., the fourth microchannel 1024d and any additional microchannels 1024 positioned farther from the through substrate vias 1030 than the forth microchannel 1024d) may comprise a constant fluid cross sectional area An, even though the distance Dn is greater than the distance D2. In such an embodiment, an increase in cross-sectional fluid area occurs between the second fluid microchannel 1024b and third fluid microchannel 1024c but subsequent fluid microchannels 1024d have the same cross-sectional fluid area as the third fluid microchannel 1024c.

Figure 12B:
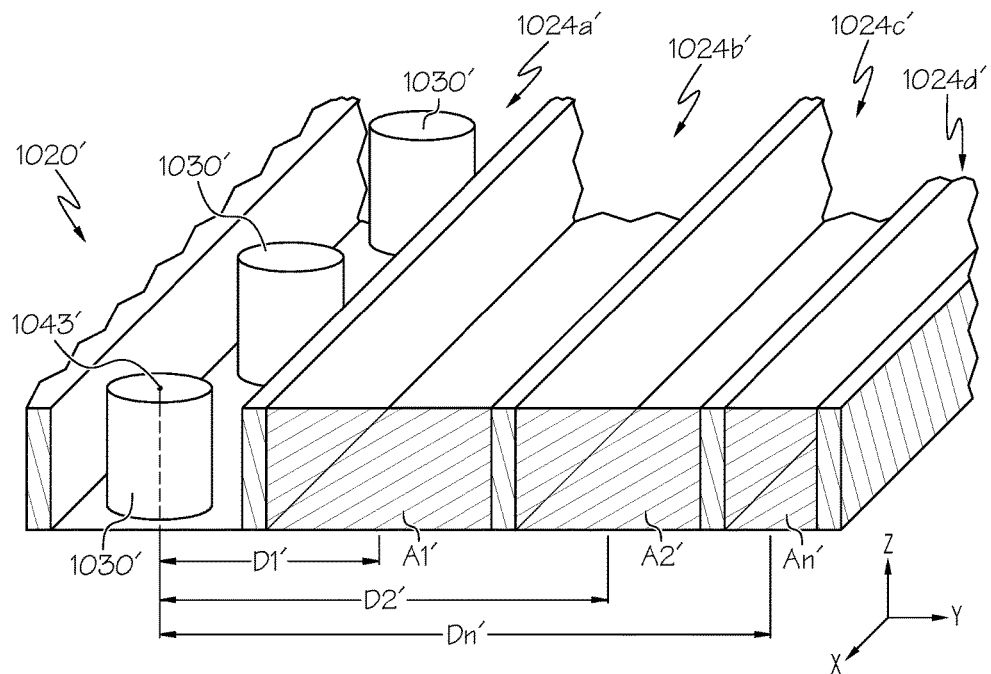
FIG. 12B schematically depicts another cross-sectional side view of a cooling chip structure comprising through substrate vias and fluid microchannels of varying cross-sectional fluid area according to one or more embodiments shown and described herein.

Referring to FIG. 12B, another cross-sectional side view of a cooling chip structure 1020' having fluid microchannels 1024' of varying cross-sectional fluid area as a function of the distance from one or more through substrate vias 1030' is depicted. As depicted, the one or more through substrate vias 1030' are disposed within a first fluid microchannel 1024a'. A second fluid microchannel 1024b' is adjacent the first fluid microchannel 1024a' and a third fluid microchannel 1024c' is adjacent the second fluid microchannel 1024b' such that the second fluid microchannel 1024b' is positioned between the first fluid microchannel 1024a' and the third fluid microchannel 1024c'. The second fluid microchannel 1024b' is positioned at a first distance D1' along a depicted Y-axis from a midpoint 1043' of an individual through substrate via 1030'. The third fluid microchannel 1024c' is position at a second distance D2' along the depicted Y-axis from a midpoint 1043' of an individual through substrate via 1030'. The second distance D2' is greater than the first distance D1'. Similarly, the second fluid microchannel 1024b' has a first cross-sectional fluid area A1' and the third fluid microchannel 1024c' has a second cross-sectional fluid area A2'. The second cross-section area A2' is less than the first cross-sectional fluid area A1'. In some embodiments, as the distance between each adjacent fluid microchannel 1024a', 1024b', 1024c' and the closest through substrate via 1030' increases, the cross-sectional fluid area of each adjacent fluid microchannel decreases.

For example, a second fluid microchannel 1024b' is positioned a first distance of D1' from an individual through substrate via 1030' disposed within the first fluid microchannel 1024a' and comprises a first cross-sectional fluid area A1'. The third fluid microchannel 1024c' is positioned a second distance of D2' from an individual through substrate via 1030' disposed within the first fluid microchannel 1024a' and comprises a second cross-sectional fluid area A2'. The first distance D1' is less than the second distance D2' and the first cross sectional fluid area A1' is greater than the second cross-sectional fluid area A2'. Further, a fourth fluid microchannel 1024d' is positioned a distance Dn' from an individual through substrate via 1030' disposed within the first fluid microchannel 1024a' and comprises a cross-sectional fluid area An'. The distance Dn' is greater than both the first distance D1' and the second distance D2' and the cross sectional area An' may be less than both the first cross sectional fluid area A1' and the second cross-sectional fluid area A2'. In other embodiments, as the distance between each adjacent fluid microchannel 1024a', 1024b', 1024c', 1024d' and the closest through substrate via 1030 increases, the cross-sectional fluid area of each adjacent fluid microchannel 1024a', 1024b', 1024c', 1024d' decreases until a defined minimum cross-sectional fluid area is reached. For example, each subsequent fluid microchannel 1024' positioned beyond the third fluid microchannel 1024c' (e.g., the fourth microchannel 1024d' and any additional microchannels 1024' positioned farther from the through substrate vias 1030' than the forth microchannel 1024d') may comprise a constant fluid cross sectional area An', even though the distance Dn' is greater than the distance D2'. In such an embodiment, a decrease in cross-sectional fluid area occurs between the second fluid microchannel 1024b' and third fluid microchannel 1024c' but subsequent fluid microchannels 1024d' have the same cross-sectional fluid area as the third fluid microchannel 1024c'.

Figure 13A:
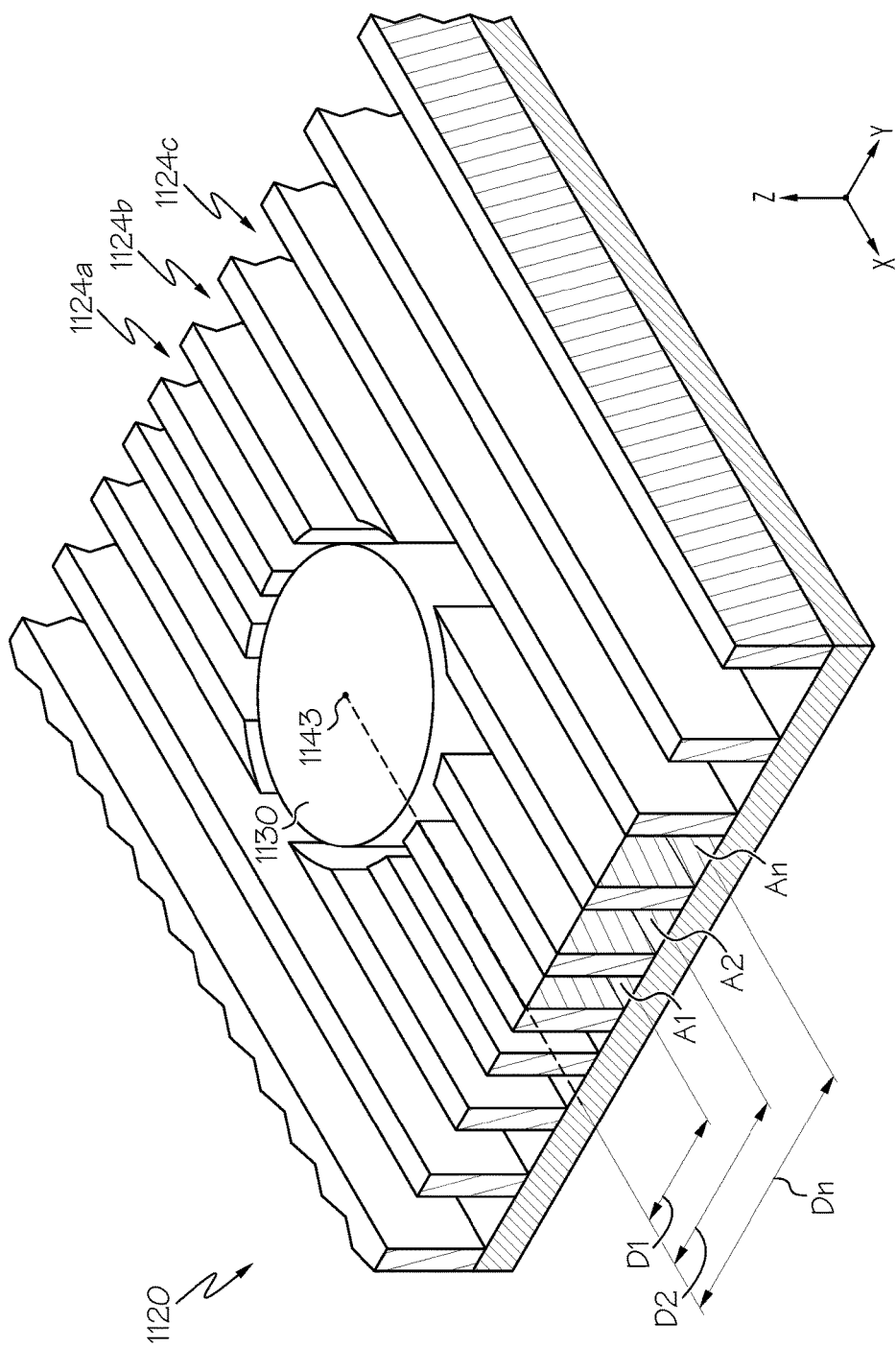
FIG. 13A schematically depicts a top perspective view of a cooling chip structure comprising a through substrate via intersecting fluid microchannels of varying cross-sectional fluid area according to one or more embodiments shown and described herein.

Referring now to FIG. 13A, a top perspective view of a cooling chip structure 1120 having fluid microchannels 1124 of varying cross-sectional fluid areas as a function of the distance from a through substrate via which intersects one or more of the fluid microchannels 1124 is depicted. As depicted, a first fluid microchannel 1124a is positioned a distance D1 along a depicted Y-axis from a midpoint 1143 of the through substrate via 1130 and comprises a cross-sectional fluid area A1. A second fluid microchannel 1124b is positioned a distance D2 along the depicted Y-axis from the midpoint 1143 of the through substrate via 1130 and comprises a cross-sectional fluid area A2. A third fluid microchannel 1124c is positioned a distance Dn along the depicted Y-axis from the midpoint 1143 of the through substrate via 1130 and comprises a cross-sectional fluid area An. The distance D2 is greater than distance D1, i.e. D2>D1. Further, the cross-sectional fluid area A2 of the second fluid microchannel 1124b is larger than the cross-sectional fluid area A1 of the first fluid microchannel 1124a.

Moreover, some embodiments comprise a third fluid microchannel 1124c and additional fluid microchannels 1124 each positioned a distance from the midpoint 1143 of the through substrate via 1130 where the distance Dn is greater than the distance D2 and each comprise a cross-sectional fluid area An that is greater than the cross-sectional fluid area A2. In other embodiments, the third fluid microchannel 1124c and additional fluid microchannels 1124 that are positioned a distance greater than D2 from the midpoint 1143 of the through substrate via 1130 have a cross-sectional fluid area An that is equal to the cross-sectional fluid area A2. For example, the third fluid microchannel 1024c and each subsequent fluid microchannel are positioned a distance Dn from the midpoint 1143 of the through substrate via 1130 that is greater than the distance D2. In operation, fluid microchannels 1124 with smaller cross-sectional fluid areas facilitate a higher velocity of fluid flow than fluid microchannels 1124 having a comparatively larger cross sectional fluid area, thus providing higher cooling performance when placed closer to through substrate vias 1130 than fluid microchannels 1124 having a larger cross-sectional fluid area.

Figure 13B:
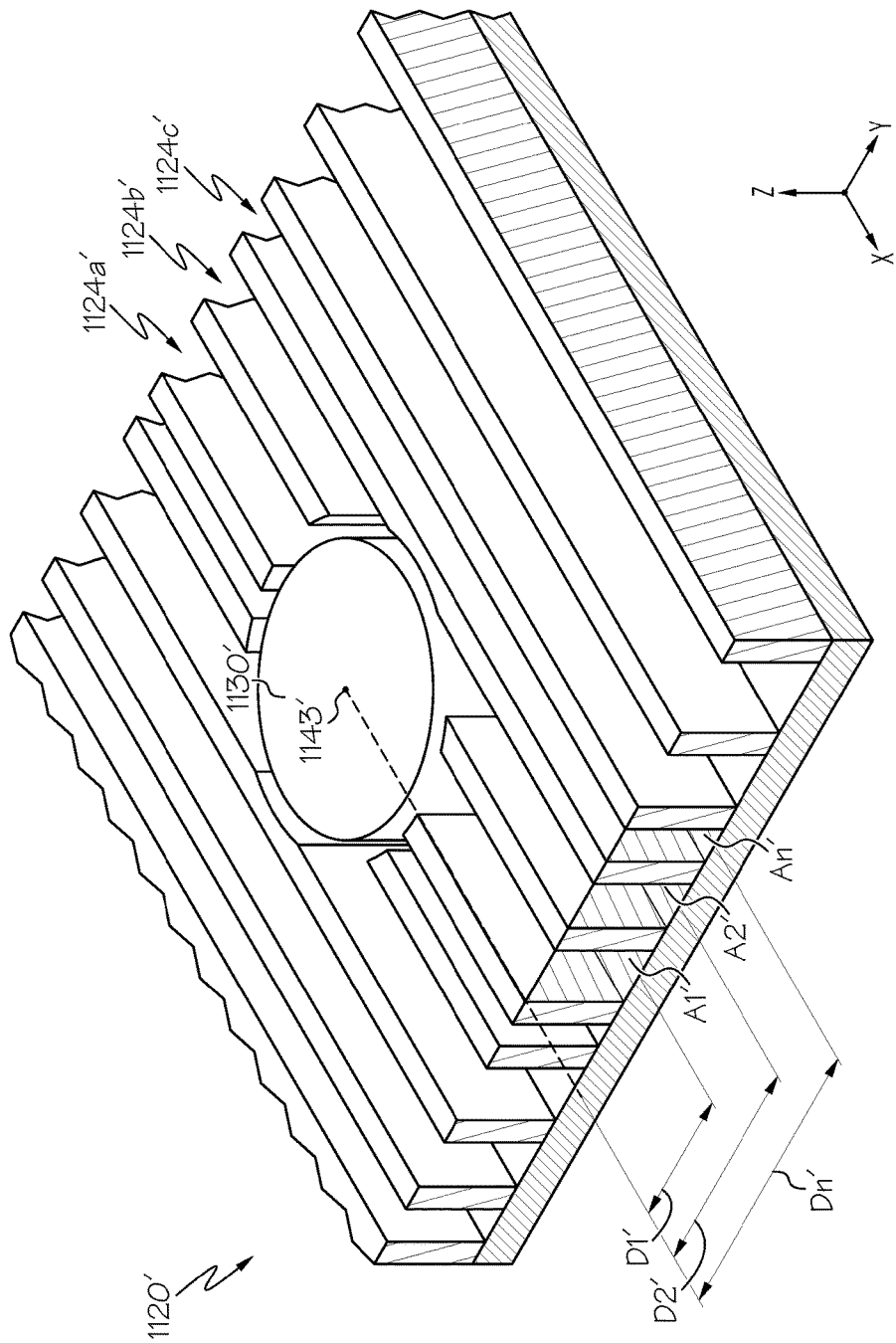
FIG. 13B schematically depicts another top perspective view of a cooling chip structure comprising a through substrate via intersecting fluid microchannels of varying cross-sectional fluid area according to one or more embodiments shown and described herein.

Referring now to FIG. 13B, a top perspective view of a cooling chip structure 1120' having fluid microchannels 1124' of varying cross-sectional fluid areas as a function of the distance from a through substrate via which intersects one or more of the fluid microchannels 1124' is depicted. As depicted, a first fluid microchannel 1124a' is positioned a distance D1' along a depicted Y-axis from a midpoint 1143' of the through substrate via 1130' and comprises a cross-sectional fluid area A1'. A second fluid microchannel 1124b' is positioned a distance D2' along the depicted Y-axis from the midpoint 1143' of the through substrate via 1130' and comprises a cross-sectional fluid area A2'. A third fluid microchannel 1124c' is positioned a distance Dn' along the depicted Y-axis from the midpoint 1143' of the through substrate via 1130' and comprises a cross-sectional fluid area An'. The distance D2' is greater than distance D1', i.e. D2'>D1'. Further, the cross-sectional fluid area A2' of the second fluid microchannel 1124b' is smaller than the cross-sectional fluid area A1' of the first fluid microchannel 1124a'.

Moreover, some embodiments comprise a third fluid microchannel 1124c' and additional fluid microchannels 1124' each positioned a distance from the midpoint 1143' of the through substrate via 1130' where the distance Dn' is greater than the distance D2' and each comprise a cross-sectional fluid area An' that is less than the cross-sectional fluid area A2'. In other embodiments, the third fluid microchannel 1124c' and additional fluid microchannels 1124' that are positioned a distance greater than D2' from the midpoint 1143' of the through substrate via 1130' have a cross-sectional fluid area An' that is equal to the cross-sectional fluid area A2'. For example, the third fluid microchannel 1024c' and each subsequent fluid microchannel are positioned a distance Dn' from the midpoint 1143' of the through substrate via 1130' that is greater than the distance D2'. In operation, fluid microchannels 1124' with larger cross-sectional fluid areas facilitate a lower velocity of fluid flow than fluid microchannels 1124' having a comparatively smaller cross-sectional fluid area, however a manifold (not shown) fluidly coupled to the fluid microchannels may provide for increased fluid flow thus providing higher cooling performance through fluid microchannels with a larger cross-sectional fluid area compared to those with smaller cross-sectional fluid areas. An example of a manifold may be found in U.S. Pat. No. 8,077,460, which is hereby incorporated in its entirety by reference.

Figure 14A:
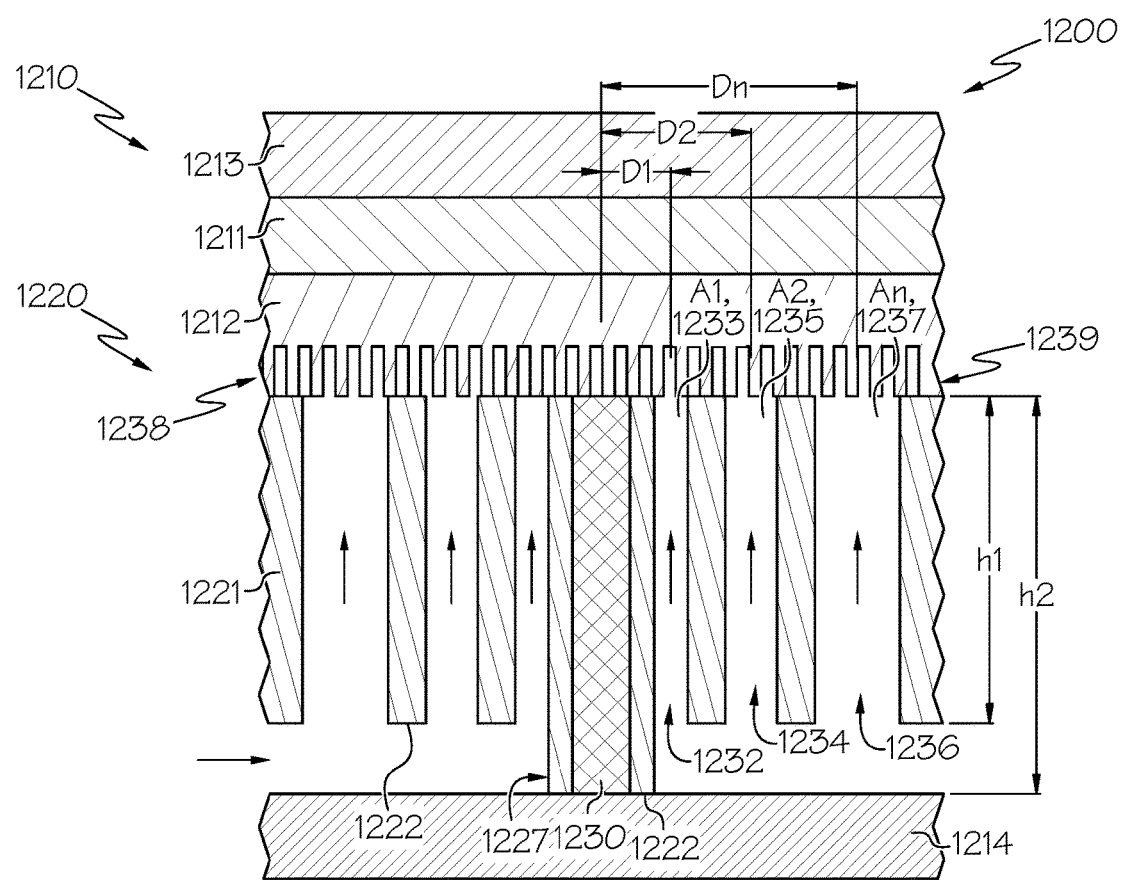
FIG. 14A schematically depicts a cross-sectional side view of an exemplary power electronics module comprising through substrate vias and a cooling chip structure having jet channels of varying cross-sectional fluid area according to one or more embodiments shown and described herein.

Referring to FIG. 14A, a cross-sectional side view of an example electronics assembly 1200 having a semiconductor device stack 1210 comprising a semiconductor device 1211 positioned between and thermally coupled to a first electrode 1212 and a second electrode 1213, as well as a cooling chip structure 1220 comprising jet channels 1232, 1234, 1236 and a through substrate via 1230 is depicted. The cooling chip structure 1220 generally comprises a jet impingement layer 1221, at least one through substrate via 1230, and a target layer 1238. The target layer 1238 is fabricated from an electrically conductive material, and may act as a first electrode as described above. Non-limiting electrically conductive materials include, but are not limited to, copper, aluminum, and gold. The target layer 1238 further includes a plurality of fins 1239 that define a plurality of microchannels. It should be understood that, in other embodiments, the target layer 1238 may not include the plurality of fins 1239.

Further, the jet impingement layer 1221 comprises a plurality of jet channels 1232, 1234, 1236 configured as a plurality of through holes. The jet impingement layer 1221 may be fabricated from a dielectric material, such as, without limitation, silicon. In the illustrated embodiment, the jet impingement layer 1221 contacts the plurality of fins 1239. The jet impingement layer 1221 further comprises the through substrate via 1230, which is electrically coupled to a third electrode 1214. To ensure a gap between a surface 1222 of the jet impingement layer 1221 and the third electrode 1214, through which the dielectric cooling fluid to flow, a portion 1227 of the jet impingement layer 1221 surrounding the through substrate via 1230 has a first height $h_2$ that is greater than a second height $h_1$ of the jet impingement layer 1221 surrounding the jet channels 1232, 1234, 1236. Thus, the electrically conductive through substrate via 1230 contacts the third electrode 1214, thereby providing an electrical connection between the target layer 1238 and the third electrode 1214 while also providing a gap for dielectric cooling fluid to enter the jet channels 1232, 1234, 1236.

As shown by the arrows, dielectric cooling fluid flows between the jet impingement layer 1221 and the third electrode 1214 and into the jet channels 1232, 1234, 1236. The dielectric cooling fluid exits the jet channels 1232, 1234, 1236 as impingement jets and impinges the target layer 1238. The dielectric cooling fluid flows through the plurality of fins 1239 and may be collected and removed at the fluid outlet port (not shown in FIG. 14A).

It should be understood that the through substrate vias 1230 may be provided in impingement jet cooling structures other than that shown in FIG. 14A. Further, through substrate via 1230 may make contact with the third electrode 1214 in ways other than that shown in FIG. 14A. In one example, the height of the jet impingement layer 1221 is uniform (i.e., not larger at the through substrate via), and contact is made between the through substrate via 1230 and the third electrode by raised pillars that extend from the surface of the third electrode 1214 to make electrical contact with the through substrate via 1230. In yet another example, the entire surface 1222 of the jet impingement layer 1221 contacts the third electrode 1214, and the third electrode 1214 further includes through holes through which dielectric cooling fluid flows from a fluid inlet channel or chamber. In still further embodiments, the plurality of fins may be disposed within the semiconductor device itself and a metallization layer is disposed on the plurality of fins to provide an electrically conductive target layer that also acts as a first electrode. In yet other embodiments, an electrically conductive target layer may be disposed between a discrete first electrode (not shown) and a jet impingement layer. Other configurations are also possible.

As depicted, the cooling chip structure 1220 further comprises a plurality of jet channels 1232, 1234, 1236 having varying cross-sectional fluid areas disposed adjacent the through substrate via 1230. The plurality of jet channels 1232, 1234, 1236 fluidly couple a fluid inlet port 122 and a fluid outlet port 123 (not shown in FIG. 14). A first jet channel 1232 has a first cross-sectional fluid area A1, 1233 defining the opening by which dielectric cooling fluid may flow through and is positioned a first distance D1 from the through substrate via 1230. A second jet channel 1234 has a second cross-sectional fluid area A2, 1235 defining the opening by which dielectric cooling fluid may flow through and is positioned a second distance D2 from the through substrate via 1230. Further, a third jet channel 1236 has a third cross-sectional fluid area An, 1237 defining the opening by which dielectric cooling fluid may flow through and is positioned a third distance Dn from the through substrate via 1230. While three jet channels 1232, 1234, 1236 are depicted, it should be understood that any number of jet channels are contemplated.

As depicted in FIG. 14A, the second distance D2 is greater than the first distance D1 and the second cross-sectional fluid area A2, 1235 is greater than that first cross-sectional fluid area A1, 1233. In some embodiments, the third distance Dn is greater than the second distance D2 and the third cross-sectional fluid area An, 1237 is greater than the second cross-sectional fluid area A2, 1235. In other embodiments, the third distance Dn is greater than the second distance D2 and the third cross-sectional fluid area An, 1237 is equal to the second cross-sectional fluid area A2, 1235. Further, the third jet channel 1236, third distance Dn and third cross-sectional fluid area An, 1237 represent each adjacent jet channel having a distance Dn greater than the second distance D2.

In some embodiments, as the distance between each adjacent jet channel and the closest through substrate via 1230 increases, the cross-sectional fluid area of each adjacent jet channel may also increase. The first jet channel 1232 is positioned the first distance of D1 from the through substrate via 1230 and comprises the first cross-sectional fluid area A1. The second jet channel 1234 is positioned the second distance D2 from the through substrate via 1230 and comprises the second cross sectional fluid area A2. Further, the third jet channel 1236 is positioned a third distance Dn from the through substrate via 1230 and comprises a third cross-sectional fluid area An. In this embodiment, the first distance D1 is less than the second distance D2, which is less than the third distance Dn and the first cross sectional area A1 is less than the second cross sectional fluid area A2, which is less than a third cross sectional fluid area An. In other embodiments, as the distance between each adjacent jet channel and the closest through substrate via 1230 increases, the cross-sectional fluid area of each adjacent jet channel increases until a maximum cross-sectional fluid area is reached. In operation, because the jet channels have different cross-sectional fluid areas, the velocity of the fluid flow within the jet channel varies. For example, a jet channel with a small cross-sectional area has a higher fluid flow velocity through the jet channel than a jet channel having a larger cross-sectional area. A higher velocity of fluid flow increases removal of excess heat from localized hotspots due to the increased rate of dielectric cooling fluid introduced to the localized hotspot.

Figure 14B:
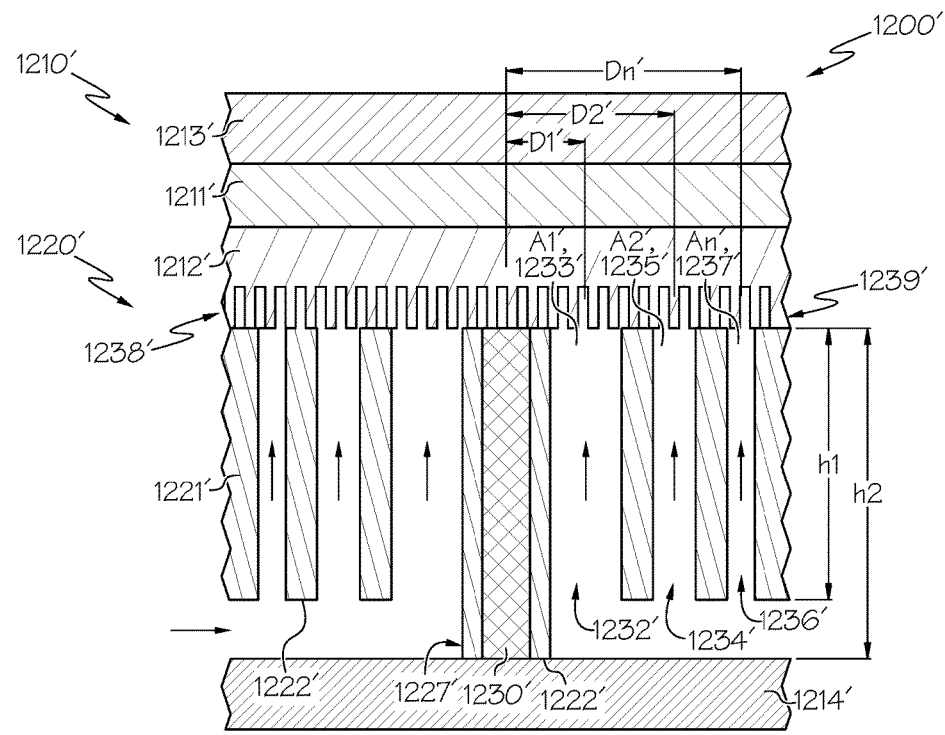
FIG. 14B schematically depicts another cross-sectional side view of an exemplary power electronics module comprising through substrate vias and a cooling chip structure having jet channels of varying cross-sectional fluid area according to one or more embodiments shown and described herein.

As depicted in FIG. 14B, the second distance D2' is greater than the first distance D1' and the second cross-sectional fluid area A2', 1235' is less than that first cross-sectional fluid area A1', 1233'. In some embodiments, the third distance Dn' is greater than the second distance D2' and the third cross-sectional fluid area An', 1237' is greater than the second cross-sectional fluid area A2', 1235'. In other embodiments, the third distance Dn' is greater than the second distance D2' and the third cross-sectional fluid area An', 1237' is equal to the second cross-sectional fluid area A2', 1235'. Further, the third jet channel 1236', third distance Dn' and third cross-sectional fluid area An', 1237' represent each adjacent jet channel having a distance Dn' greater than the second distance D2'.

In some embodiments, as the distance between each adjacent jet channel and the closest through substrate via 1230' increases, the cross-sectional fluid area of each adjacent jet channel may also increase. The first jet channel 1232' is positioned the first distance of D1' from the through substrate via 1230' and comprises the first cross-sectional fluid area A1'. The second jet channel 1234' is positioned the second distance D2' from the through substrate via 1230' and comprises the second cross sectional fluid area A2'. Further, the third jet channel 1236' is positioned a third distance Dn' from the through substrate via 1230' and comprises a third cross-sectional fluid area An'. In this embodiment, the first distance D1' is less than the second distance D2', which is less than the third distance Dn' and the first cross sectional area A1' is greater than the second cross sectional fluid area A2', which is greater than a third cross sectional fluid area An'. In other embodiments, as the distance between each adjacent jet channel and the closest through substrate via 1230' increases, the cross-sectional fluid area of each adjacent jet channel decreases until a minimum cross-sectional fluid area is reached. In operation, because the jet channels have different cross-sectional fluid areas, the velocity of the fluid flow within the jet channel varies. For example, a jet channel with a small cross-sectional area may have a higher fluid flow velocity through the jet channel than a jet channel having a larger cross-sectional area. A higher velocity of fluid flow increases removal of excess heat from localized hotspots due to the increased rate of dielectric cooling fluid introduced to the localized hotspot. However, the incorporation of a manifold (not shown) fluidly coupled to the jet channels may provide higher velocity fluid flow through jet channels having a larger cross-sectional area and lower velocity fluid flow through jet channels having a smaller cross-sectional area. The manifold may be fluidly coupled to the jet channels either between the jet impingement layer 1221' and the third electrode 1214' or between the jet impingement layer 1221' and the target layer 1238'. The manifold may operate to control the velocity of fluid flow through the jet channels.

Figure 15:
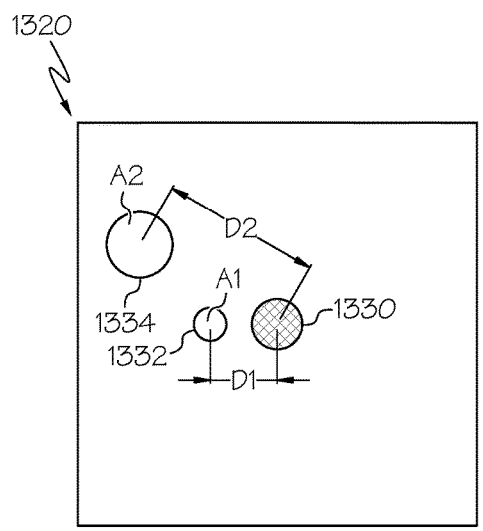
FIG. 15 schematically depicts a top view of a partial cooling chip structure having an arrangement of jet channels and a through substrate vias according to one or more embodiments shown and described herein.

Referring to FIG. 15, a partial top view of a cooling chip structure 1320 having a first jet channel 1332, a second jet channel 1334 and a through substrate via 1330 is depicted. A center of the first jet channel 1332 is positioned a first distance D1 from the center of the closest through substrate via 1330. Further, a center of the second jet channel 1334 is positioned a second distance D2 from the center of the closest through substrate via 1330. The first jet channel 1332 comprises a first cross-sectional fluid area A1 and the second jet channel 1334 comprises a second cross-sectional fluid area A2 the second cross-sectional fluid area A2 is greater than the first cross-sectional fluid area A1, and the second distance D2 is greater than the first distance D1. Thus, in operation, the first jet channel 1332 facilitates a higher velocity fluid flow than the second jet channel 1334, improving the cooling of the localized hotspot near the through substrate via 1330.

Figure 16:
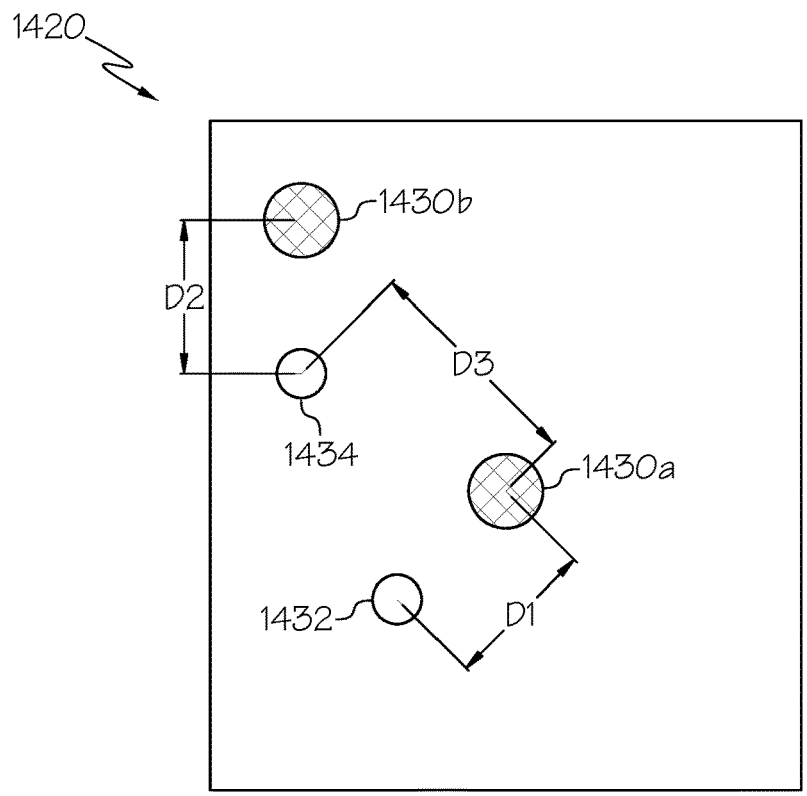
FIG. 16 schematically depicts a top view of a partial cooling chip structure having an arrangement of jet channels and through substrate vias according to one or more embodiments shown and described herein.

In an embodiment, where multiple through substrate vias and multiple jet channels are positioned within a single cooling chip structure, the distance relationships between the through substrate vias and the jet channels, which are correlated to the relative cross sectional fluid areas of the jet channels are the distances between an individual jet channel and the individual through substrate via positioned nearest to the individual jet channel. For example, referring to FIG. 16, a top view of a partial cooling chip structure 1420 having a first jet channel 1432, a second jet channel 1434, a first through substrate via 1430a, and a second through substrate via 1430b is depicted. A center of the first jet channel 1432 is positioned a first distance D1 from the center of the first through substrate via 1430a and a center of the second jet channel 1434 is positioned a second distance D2 from the center of the second through substrate via 1430b. Further, as depicted in FIG. 16, a center of the second jet channel 1434 is also positioned a third distance D3 from the center of the first through substrate via 1430a. However, because the second through substrate via 1430b is the closer of the two through substrate vias 1430a, 1430b to the second jet channel 1434, the third distance D3 is less relevant than the second distance D2 in determining the relative cross sectional fluid area relationship between the first jet channel 1432 and the second jet channel 1434.

Figure 17:
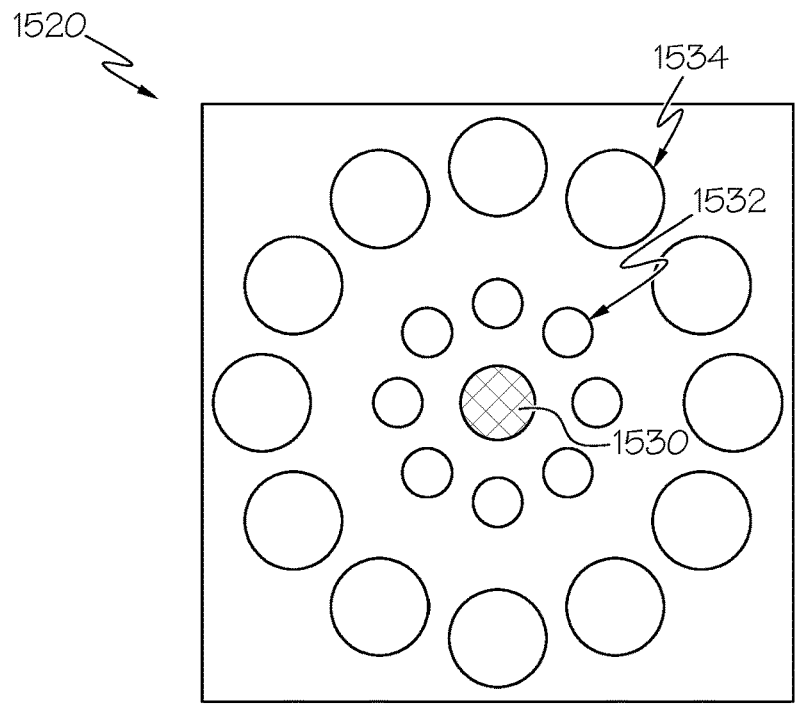
FIG. 17 schematically depicts a top view of a partial cooling chip structure having an arrangement of jet channels and through substrate vias according to one or more embodiments shown and described herein.

Referring to FIG. 17, another top view of a cooling chip structure 1520 is depicted. The cooling chip structure 1520 comprises a plurality of first jet channels 1532 and a plurality of second jet channels 1534 positioned in a circular arrangement about a through substrate via 1530. In some embodiments, the through substrate via 1530 may be encircled by a plurality of first jet channels 1532 and a plurality of second jet channels 1534. The plurality of first jet channels 1532 have a smaller distance to the through substrate via 1530; therefore have a smaller cross-sectional fluid area for dielectric cooling fluid flow as compared to the plurality of second jet channels 1534. Each of the plurality of second jet channels 1534 are positioned at a distance greater from the through substrate via 1530 than each of the plurality of first jet channels 1532, thus each of the plurality of second jet channels 1534 may have a larger cross-sectional fluid area than each of the plurality of first jet channels 1532. Thus, the plurality of first jet channels 1532 may facilitate a higher velocity fluid flow due to the relatively smaller cross-sectional areas, thus improving the cooling of the localized hotspot near the through substrate via 1530.

Figure 18:
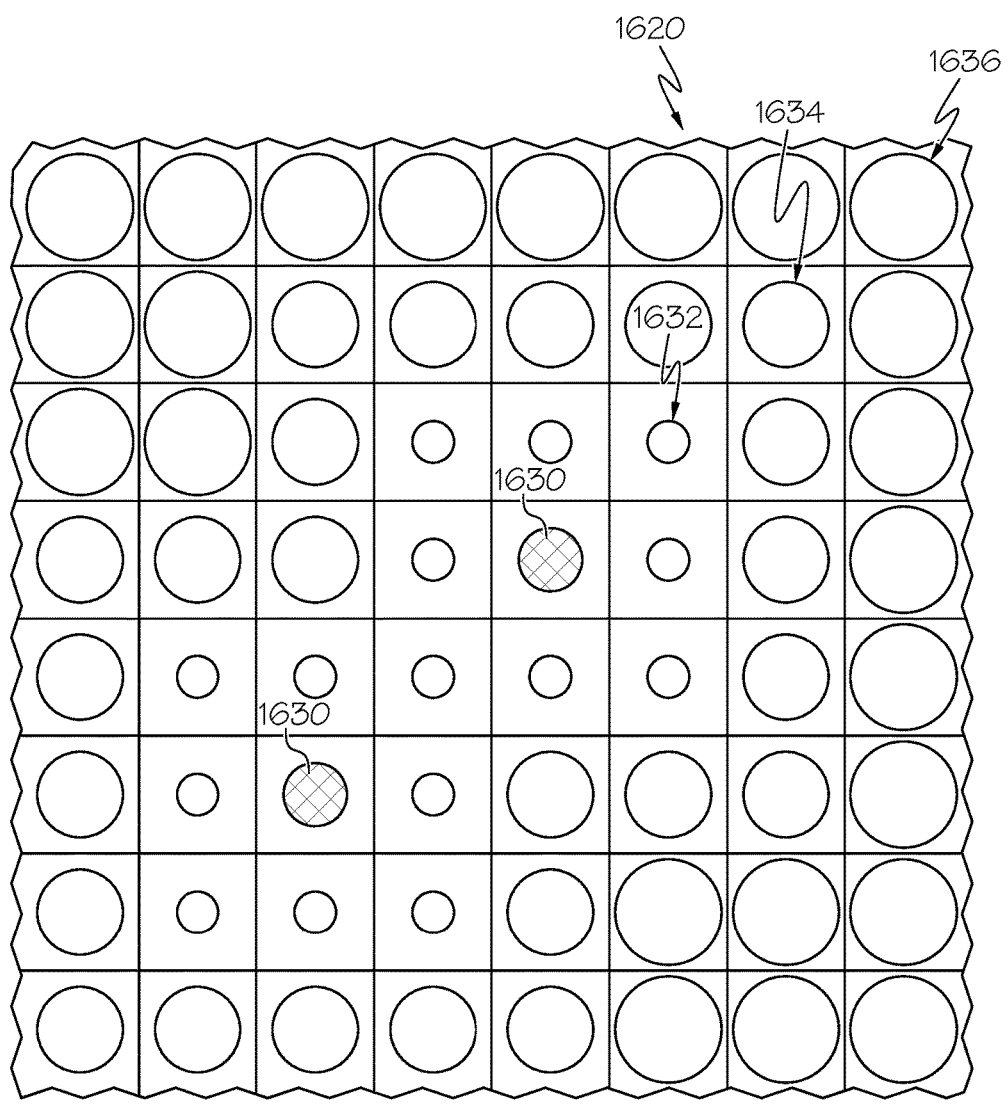
FIG. 18 schematically depicts a top view of a partial cooling chip structure having an arrangement of jet channels and through substrate vias in a grid arrangement according to one or more embodiments shown and described herein.

Referring to FIG. 18, another top view of a partial cooling chip structure 1620 is depicted. The cooling chip structure 1620 comprises a plurality of jet channels 1632, 1634, 1636 arranged in a grid. Two through substrate vias 1530 are positioned within the grid of jet channels 1632, 1634, 1636. The jet channels 1632, 1634, 1636 with the smallest distance to their closest through substrate via 1630 have a smaller cross-sectional fluid area than the other jet channels. As depicted, as the distance from the closest through substrate via 1630 increases, so does the cross-sectional fluid area of the jet channels 1632, 1634, 1636. It is noted that a grid layout and square shaped cooling chip structure 1620 are provided for illustrative purposes only. In other embodiments, a non-uniform and/or non-symmetrical jet channel and through substrate via layout are included and understood without departing from the spirit and scope of the claimed subject matter. While in other embodiments, a uniform and/or symmetrical arrangement of jet channels and through substrate vias are included and understood without departing from the spirit and scope of the claimed subject matter. In some embodiments, various closed-shapes may define the shape of the cooling chip structure 1620 and/or the semiconductor device stack 110.

It should now be understood that the embodiments described herein may be directed to electronic assemblies including a cooling chip structure with through substrate vias cooled by fluid microchannels and/or jet channels. The fluid microchannels and jet channels may be configured to have the same cross-sectional area or vary in cross-sectional area depending on their position in relation to the through substrate vias. The fluid microchannels and jet channels improve the cooling of hotspots created by the locations the through substrate vias occupy that would otherwise be accessible by cooling fluid and/or heat sinks. The positioning and sizing of the fluid microchannels and/or jet channels improve cooling fluid flow and reduce localized hotspots by producing higher velocity fluid flow at hotspot locations.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. An electronics assembly comprising:
    a cooling chip structure comprising:
        a device facing surface opposite a base surface;
        one or more sidewalls extending around a perimeter of the cooling chip structure between the device facing surface and the base surface;
        a fluid inlet port and a fluid outlet port;
        an array of channel fins defining a plurality of fluid microchannels fluidly coupled to the fluid inlet port and the fluid outlet port; and
        a through substrate via extending from the base surface of the cooling chip structure to the device facing surface of the cooling chip structure, wherein the through substrate via intersects two or more fluid microchannels of the plurality of fluid microchannels and is disposed between two channel fins of the array of channel fins.

2. The electronics assembly of claim 1, further comprising a semiconductor device stack comprising:
    a semiconductor device comprising a semiconductor material;
    a first electrode electrically and thermally coupled to a first device surface of the semiconductor device; and
    a second electrode electrically and thermally coupled to a second device surface of the semiconductor device, wherein:
        the first device surface is opposite the second device surface;
        the through substrate via is electrically coupled to the first electrode; and
        the device facing surface of the cooling chip structure is thermally coupled to the semiconductor device stack.

3. The electronics assembly of claim 2, wherein:
    the semiconductor device further comprises one or more semiconductor fluid microchannels extending into the semiconductor device and
    the one or more semiconductor fluid microchannels are in fluid communication with the plurality of fluid microchannels of the cooling chip structure.

4. The electronics assembly of claim 2, wherein the through substrate via provides a power signal receivable by the semiconductor device stack to power the semiconductor device stack.

5. The electronics assembly of claim 1, wherein the through substrate via is electrically coupled to a third electrode disposed adjacent to the base surface of the cooling chip structure.

6. An electronics assembly comprising:
a cooling chip structure comprising:
  a device facing surface opposite a base surface;
  one or more sidewalls extending around a perimeter of the cooling chip structure between the device facing surface and the base surface;
  a fluid inlet port and a fluid outlet port;
  an array of channel fins defining a plurality of fluid microchannels fluidly coupled to the fluid inlet port and the fluid outlet port; and
  a through substrate via extending from the base surface of the cooling chip structure to the device facing surface of the cooling chip structure; and
wherein:
  the through substrate via is disposed between two channel fins of the array of channel fins;
  a first fluid microchannel of the plurality of fluid microchannels is closer to a midpoint of the through substrate via along an axis than a second fluid microchannel of the plurality of fluid microchannels, wherein the first fluid microchannel comprises a first cross-sectional fluid area that is smaller than a second cross-sectional fluid area of the second fluid microchannel.

7. The electronics assembly of claim 6, further comprising a semiconductor device stack comprising:
a semiconductor device comprising a semiconductor material;
a first electrode electrically and thermally coupled to a first device surface of the semiconductor device; and
a second electrode electrically and thermally coupled to a second device surface of the semiconductor device, wherein:
  the first device surface is opposite the second device surface;
  the through substrate via is electrically coupled to the first electrode; and
  the device facing surface of the cooling chip structure is thermally coupled to the semiconductor device stack.

8. The electronics assembly of claim 7, wherein:
the semiconductor device further comprises one or more semiconductor fluid microchannels extending into the semiconductor device and
the one or more semiconductor fluid microchannels are in fluid communication with the plurality of fluid microchannels of the cooling chip structure.

9. The electronics assembly of claim 7, wherein the first electrode, the second electrode and the through substrate via comprise an electrically conductive material.

10. The electronics assembly of claim 6, further comprising a plurality of through substrate vias.

11. The electronics assembly of claim 6, wherein the plurality of through substrate vias is arranged in an octagonal arrangement within the cooling chip structure.

12. The electronics assembly of claim 6, wherein a third fluid microchannel of the plurality of microchannels positioned farther from the midpoint of the through substrate via along the axis than the second fluid microchannel, and the third fluid microchannel has a third cross-sectional fluid area greater than the second cross-sectional fluid area of the second fluid microchannel.

13. The electronics assembly of claim 6, wherein a third fluid microchannel of the plurality of microchannels positioned farther from the midpoint of the through substrate via along the axis than the second fluid microchannel, and the third fluid microchannel has a third cross-sectional fluid area equal to the second cross-sectional fluid area of the second fluid microchannel.

14. The electronics assembly of claim 6, wherein the through substrate via intersects a plurality of fluid microchannels, and a dielectric cooling fluid flow within the plurality of fluid microchannels converges around the through substrate via.

15. An electronics assembly comprising:
a cooling chip structure comprising:
  a device facing surface opposite a base surface;
  one or more sidewalls extending around a perimeter of the cooling chip structure between the device facing surface and the base surface;
  a fluid inlet port and a fluid outlet port;
  an array of channel fins defining a plurality of fluid microchannels fluidly coupled to the fluid inlet port and the fluid outlet port, wherein the plurality of fluid microchannels comprises a first fluid microchannel and a second fluid microchannel; and
  a through substrate via extending from the base surface of the cooling chip structure to the device facing surface of the cooling chip structure, wherein the through substrate via is positioned adjacent the first fluid microchannel and the second fluid microchannel and between two channel fins of the array of channel fins.

16. The electronics assembly of claim 15, wherein the through substrate via comprises a first substrate via and the cooling chip structure further comprises a second through substrate via and the first fluid microchannel is positioned between the first through substrate via and the second through substrate via.

17. The electronics assembly of claim 15, further comprising a semiconductor device stack comprising:
a semiconductor device comprising a semiconductor material;
a first electrode electrically and thermally coupled to a first device surface of the semiconductor device; and
a second electrode electrically and thermally coupled to a second device surface of the semiconductor device, wherein:
  the first device surface is opposite the second device surface;
  the through substrate via is electrically coupled to the first electrode; and
  the device facing surface of the cooling chip structure is thermally coupled to the semiconductor device stack.

18. The electronics assembly of claim 17, wherein:
the semiconductor device further comprises one or more semiconductor fluid microchannels extending into the semiconductor device; and
the one or more semiconductor fluid microchannels are in fluid communication with the plurality of fluid microchannels of the cooling chip structure.

19. The electronics assembly of claim 1, wherein individual channel fins of the plurality of channel fins are one of straight-fins and wavy-fins.

20. The electronics assembly of claim 15, wherein individual channel fins of the plurality of channel fins are one of straight-fins and wavy-fins.

\* \* \* \* \*